(12) United States Patent
Boukai et al.

(10) Patent No.: US 10,205,080 B2
(45) Date of Patent: Feb. 12, 2019

(54) SYSTEMS AND METHODS FOR FORMING THERMOELECTRIC DEVICES

(71) Applicant: Matrix Industries, Inc., Menlo Park, CA (US)

(72) Inventors: Akram I. Boukai, Menlo Park, CA (US); Douglas W. Tham, Santa Clara, CA (US)

(73) Assignee: MATRIX INDUSTRIES, INC., Menlo Park, CA (US)

( * ) Notice: Subject to any disclaimer, the term of this patent is extended or adjusted under 35 U.S.C. 154(b) by 22 days.

(21) Appl. No.: 14/372,443

(22) PCT Filed: Jan. 17, 2013

(86) PCT No.: PCT/US2013/021900
§ 371 (c)(1),
(2) Date: Jul. 15, 2014

(87) PCT Pub. No.: WO2013/109729
PCT Pub. Date: Jul. 25, 2013

(65) Prior Publication Data
US 2014/0373888 A1 Dec. 25, 2014

Related U.S. Application Data

(60) Provisional application No. 61/620,920, filed on Apr. 5, 2012, provisional application No. 61/587,607, filed on Jan. 17, 2012.

(51) Int. Cl.
*H01L 35/32* (2006.01)
*H01L 35/34* (2006.01)

(52) U.S. Cl.
CPC ............. *H01L 35/32* (2013.01); *H01L 35/34* (2013.01)

(58) Field of Classification Search
None
See application file for complete search history.

(56) References Cited

U.S. PATENT DOCUMENTS

| 3,653,989 A | 4/1972 | Widmer |
| 4,078,945 A | 3/1978 | Gonsiorawski |
| (Continued) | | |

FOREIGN PATENT DOCUMENTS

| CN | 1382626 A | 12/2002 |
| JP | S63266829 A | 11/1988 |
| (Continued) | | |

OTHER PUBLICATIONS

Wolfsteller, A., et al. "Comparison of the top-down and bottom-up approach to fabricate nanowire-based silicon/germanium heterostructures." Thin Solid Films 518.9 (2010): 2555-2561.*
(Continued)

*Primary Examiner* — Walter H Swanson
*Assistant Examiner* — Kien Ly
(74) *Attorney, Agent, or Firm* — Wilson Sonsini Goodrich & Rosati

(57) ABSTRACT

A method for forming a thermoelectric element for use in a thermoelectric device comprises providing a mask adjacent to a substrate, the mask comprising a polymeric mixture, and bringing a template having a first pattern in contact with the mask to define a second pattern in the mask. The first pattern comprises one of holes and rods, and the second pattern comprises the other of holes and rods. Holes or rods of the second pattern expose portions of the substrate. Next, an etching layer is deposited adjacent to exposed portions of the substrate. The etching layer is configured to aid in etching the substrate. The substrate is subsequently etched with the aid of the etching layer.

20 Claims, 22 Drawing Sheets

(56) References Cited

U.S. PATENT DOCUMENTS

| | | | |
|---|---|---|---|
| 4,092,445 A | 5/1978 | Tsuzuki et al. | |
| 4,681,657 A | 7/1987 | Hwang et al. | |
| 4,985,722 A * | 1/1991 | Ushijima | B29C 31/00 134/66 |
| 5,089,293 A | 2/1992 | Bohara et al. | |
| 5,139,624 A | 8/1992 | Searson et al. | |
| 5,206,523 A | 4/1993 | Goesele et al. | |
| 5,552,328 A | 9/1996 | Orlowski et al. | |
| 5,565,084 A | 10/1996 | Lee et al. | |
| 5,695,557 A | 12/1997 | Yamagata et al. | |
| 5,767,020 A | 6/1998 | Sakaguchi et al. | |
| 5,868,947 A | 2/1999 | Sakaguchi et al. | |
| 5,873,003 A | 2/1999 | Inoue et al. | |
| 5,895,223 A | 4/1999 | Peng et al. | |
| 5,970,361 A | 10/1999 | Kumomi et al. | |
| 5,981,400 A | 11/1999 | Lo | |
| 5,990,605 A | 11/1999 | Yoshikawa et al. | |
| 6,017,811 A | 1/2000 | Winton et al. | |
| 6,093,941 A | 7/2000 | Russell et al. | |
| 6,313,015 B1 | 11/2001 | Lee et al. | |
| 6,762,134 B2 | 7/2004 | Bohn et al. | |
| 6,790,785 B1 | 9/2004 | Lin et al. | |
| 6,803,260 B2 | 10/2004 | Shin et al. | |
| 6,882,051 B2 | 4/2005 | Majumdar et al. | |
| 7,075,161 B2 | 7/2006 | Barth | |
| 7,115,971 B2 | 10/2006 | Stumbo et al. | |
| 7,135,728 B2 | 11/2006 | Duan et al. | |
| 7,161,168 B2 * | 1/2007 | Heath | B82Y 10/00 257/15 |
| 7,189,435 B2 | 3/2007 | Tuominen et al. | |
| 7,190,049 B2 | 3/2007 | Tuominen et al. | |
| 7,254,953 B2 | 8/2007 | Callas | |
| 7,291,282 B2 | 11/2007 | Tong | |
| 7,309,830 B2 | 12/2007 | Zhang et al. | |
| 7,465,871 B2 | 12/2008 | Chen et al. | |
| 7,569,941 B2 | 8/2009 | Majumdar et al. | |
| 7,572,669 B2 | 8/2009 | Tuominen et al. | |
| 7,629,531 B2 | 12/2009 | Stark | |
| 7,645,625 B2 * | 1/2010 | Ono | H01L 21/30608 438/38 |
| 7,675,084 B2 | 3/2010 | Wierer, Jr. et al. | |
| 7,960,258 B2 | 6/2011 | Chao et al. | |
| 8,087,254 B2 | 1/2012 | Arnold | |
| 8,101,449 B2 | 1/2012 | Liang et al. | |
| 8,278,191 B2 | 10/2012 | Hildreth et al. | |
| 8,324,699 B2 | 12/2012 | Ichijo et al. | |
| 8,486,843 B2 | 7/2013 | Li et al. | |
| 8,641,912 B2 | 2/2014 | Heath et al. | |
| 9,065,016 B2 | 6/2015 | Peter et al. | |
| 9,209,375 B2 | 12/2015 | Boukai et al. | |
| 9,263,662 B2 | 2/2016 | Boukai I, et al. | |
| 2004/0152240 A1 | 8/2004 | Dangelo | |
| 2005/0133254 A1 | 6/2005 | Tsakalakos | |
| 2005/0176264 A1 | 8/2005 | Lai et al. | |
| 2005/0215063 A1 | 9/2005 | Bergman | |
| 2005/0253138 A1 | 11/2005 | Choi et al. | |
| 2006/0032526 A1 | 2/2006 | Fukutani et al. | |
| 2006/0118158 A1 | 6/2006 | Zhang et al. | |
| 2006/0185710 A1 | 8/2006 | Yang et al. | |
| 2007/0258213 A1 | 11/2007 | Chen et al. | |
| 2007/0277866 A1 | 12/2007 | Sander et al. | |
| 2008/0019876 A1 | 1/2008 | Chau et al. | |
| 2008/0112669 A1 * | 5/2008 | Choi | B82Y 20/00 385/36 |
| 2008/0173344 A1 | 7/2008 | Zhang et al. | |
| 2008/0271772 A1 | 11/2008 | Leonov et al. | |
| 2008/0314429 A1 | 12/2008 | Leonov | |
| 2009/0020148 A1 * | 1/2009 | Boukai | H01L 35/26 136/201 |
| 2009/0020188 A1 | 1/2009 | Ulicny et al. | |
| 2009/0117741 A1 | 5/2009 | Heath et al. | |
| 2010/0035163 A1 * | 2/2010 | Kobrin | G03B 9/10 430/2 |
| 2010/0065810 A1 | 3/2010 | Goesele et al. | |
| 2010/0126548 A1 | 5/2010 | Jang et al. | |
| 2010/0147350 A1 | 6/2010 | Chou et al. | |
| 2010/0193001 A1 | 8/2010 | Hirono et al. | |
| 2010/0248449 A1 * | 9/2010 | Hildreth | B81C 1/00071 438/460 |
| 2011/0114145 A1 | 5/2011 | Yang et al. | |
| 2011/0114146 A1 | 5/2011 | Scullin | |
| 2011/0168978 A1 | 7/2011 | Kochergin | |
| 2011/0179806 A1 | 7/2011 | Ipposhi et al. | |
| 2011/0215441 A1 * | 9/2011 | Lin | H01L 21/306 257/618 |
| 2011/0263119 A1 * | 10/2011 | Li | H01L 21/30604 438/653 |
| 2011/0266521 A1 * | 11/2011 | Ferrari | B82Y 10/00 257/14 |
| 2012/0097204 A1 | 4/2012 | Yu et al. | |
| 2012/0152295 A1 | 6/2012 | Matus et al. | |
| 2012/0160290 A1 | 6/2012 | Chen et al. | |
| 2012/0167936 A1 | 7/2012 | Park et al. | |
| 2012/0174956 A1 | 7/2012 | Smythe et al. | |
| 2012/0217165 A1 | 8/2012 | Feng et al. | |
| 2012/0282435 A1 | 11/2012 | Yang et al. | |
| 2012/0290051 A1 | 11/2012 | Boyden et al. | |
| 2012/0295074 A1 | 11/2012 | Yi et al. | |
| 2012/0319082 A1 | 12/2012 | Yi et al. | |
| 2012/0326097 A1 | 12/2012 | Ren et al. | |
| 2013/0019918 A1 * | 1/2013 | Boukai | H01L 35/34 136/238 |
| 2013/0052762 A1 | 2/2013 | Li et al. | |
| 2013/0087180 A1 | 4/2013 | Stark et al. | |
| 2013/0175484 A1 | 7/2013 | Ren et al. | |
| 2013/0186445 A1 | 7/2013 | Lorimer et al. | |
| 2014/0117380 A1 | 5/2014 | Loboda et al. | |
| 2014/0306250 A1 | 10/2014 | Gardner et al. | |
| 2014/0326287 A1 | 11/2014 | Wiant et al. | |
| 2015/0083180 A1 | 3/2015 | Lang | |
| 2015/0101788 A1 | 4/2015 | Smith et al. | |
| 2015/0162517 A1 | 6/2015 | Kasichainula | |
| 2015/0179911 A1 | 6/2015 | Lemmer et al. | |
| 2015/0216718 A1 | 8/2015 | Diller et al. | |
| 2015/0228883 A1 | 8/2015 | Boukai et al. | |
| 2015/0280099 A1 | 10/2015 | Boukai et al. | |
| 2015/0325772 A1 | 11/2015 | Boukai et al. | |
| 2016/0035956 A1 | 2/2016 | Carroll et al. | |
| 2016/0197259 A1 | 7/2016 | Boukai et al. | |

FOREIGN PATENT DOCUMENTS

| | | |
|---|---|---|
| JP | 2004193526 A | 7/2004 |
| JP | 2006261451 A | 9/2006 |
| JP | 2007300127 A | 11/2007 |
| JP | 2010192580 A | 9/2010 |
| JP | 2010537430 A | 12/2010 |
| JP | 2004-193526 A | 7/2014 |
| WO | WO 02/23607 A1 | 3/2002 |
| WO | WO 2010/003629 A2 | 1/2010 |
| WO | WO 2011/049804 A2 | 4/2011 |
| WO | WO-2012068426 A2 | 5/2012 |
| WO | WO-2013012842 A1 | 1/2013 |
| WO | WO 2013/109729 A1 | 7/2013 |
| WO | WO 2014/028903 A1 | 2/2014 |
| WO | WO-2014070795 A1 | 5/2014 |
| WO | WO 2014/179622 A1 | 11/2014 |
| WO | WO 2015/134394 A1 | 9/2015 |

OTHER PUBLICATIONS

Huang, Zhipeng, et al. "Metal-assisted chemical etching of silicon: a review." Advanced materials 23.2 (2011): 285-308.*

Agnes, et al. Doping of the nanocrystalline semiconductor zinc oxide with the donor indium, Amer Institute of Phystcs, vol. 83, No. 6, 1204, (Aug. 11, 2003).

Beckman, et al. Fabrication of Conducting. Silicon nanowire Arrays, J. Appi. Phys. 96 (10), 5921-5923'(2004).

Beckman, et al., Bridging Dimensions: Demultiplexing Ultrahigh-Density nanowire Circuits, Science 2005, 310: 465-468.

(56) References Cited

OTHER PUBLICATIONS

Behnen. Quantitative examination of the thermoelectric power of n-typesilicon in the phono drag regime.Journal of Applied Physics, vol. 67, pp. 287-292, Jan. 1, 1990.
Bera, et al. Marked Effects of Alloying on the Thermal Conductivity of nanoporous Materials, Mar. 19, 2010, American Physical Society Physical Review Letters, 104, pp. 115502-01 to 115502-4.
Boukai, et al. Silicon nanowires as efficient thermoelectric materials. nature, vol. 451, pp. 168-171, Jan. 10, 2008.
Boukai, et al. Size-Dependent transport and thermoelectric properties of individual polycrystalline bismuth nanowires. Advanced Materials, 18, pp. 864-869, 2006.
Bunimovich, et al. Quantitative Real-Time Measurements of DnA Hybridization with Alkylated nonoxidized Silicon nanowires in Electrolyte Solution, JACS 2006, 128: 16323-16331.
Chadwick, et al. Plane waves in an elastic solid conducting heat. Journal of the Mechanics and Physics of Solids 6, 223-230 (1958).
Chen, et al. Recent developments in thermoelectric materials. International Materials Reviews, vol. 48, pp. 4566, 2003.
Choi, et al. Fabrication of bismuth nanowires with a silver nanocrystal shadowmask, J. Vac. Sci. Tech. A—Vac. Surf. And Films, 18, 1236, 1328 (2000).
Choi, et al. Fabrication of nanometer size photoresist wire patterns With a silver nanocrystal shadowmask. J. Vac. Sci. & Tech. A—Vac. Surf. And Films, 17, 1425 (1999).
Chung, et al. Fabrication and Alignment of Wires in Two-Dimensions. The Journal of PhysiCal Chemistry B. 102. 6685 (1998).
Collier, et al. nanocrystal superlattices. Annu. Rev. Phys. Chem. 1998, 49: 371-404.
Deresiewicz. Plane waves in a thermoelastic solid. Journal of the Acoustical Society of America 29, 204-209 (1957).
Diehl, et al. Self-Assembly of Deterministic Carbon nanottibe Wiring networks. Angew. 'Chem. Int Ed. 41, 353 (2002).
European search report and opinion dated Mar. 25, 2014 for EP Application No. 11835180.8.
Fan, et al. Self-Oriented Regular Arrays of Carbon nanotubes and their Field Emission Devices. Science, v. 283, p. 512 (Jan. 22, 1999).
Geballe, et al. Seebeck Effect in Silicon. Physical Review, vol. 98, pp. 940-947, May 15, 1955.
Green, et al., A 160-kilobit molecular electronic memory patterned at 1011 bits per square centimeter, nature 2007, 445: 414-417.
Gurevich. Thermoelectric properties of conductors J. Phys. (U.S.S.R.) 9, 477 (1945).
Harman, et al. Quantum dot superlattice thermoelectric materials and devices. Science, vol. 297, pp. 22292232, Sep. 27, 2002.
Haynes, et al. nanosphere Lithography: A Versatile nanofabrication Tool for Studies of Size-Dependent nanoparticle Optics. J. Phys. Chem. B, 105, 5599-5611 (2001).
Heath, et al. A Defect-Tolerant Computer Architecture: Opportunities for nanotechnology, Science 1998, 280: 1716-1721.
Heath, et al. Pressure/Temperature Phase Diagrams and Superlattices of Organically Functionalized Metal nanocrystal Monolayers: The Influence of Particle Size, Size Distribution, and Surface Passivant, J. Phys. Chem. B 1997, 101: 189-197.
Herring. Theory of the thermoelectric power of semiconductors. Physical Review, vol. 96, No. 5, pp. 11631187, 1954.
Hicks, et al.. Thermoelectric figure of merit of a one-dimensional conductor. Physical Review B 47, 1 6631-1 6634 (1993).
Hochbaum, et al. Enchanced thermoelectric performance of rough silicon nanowires, Jan. 2008, nature Publishing Group, vol. 451, pp. 1-6.
Hsu, et al. Cubic AgPbmSbTe2+m: Bulk thermoelectric materials with high Figure of Merit. Science, vol. 303, pp. 818-821, Feb. 6, 2004.
Huang, et al. Spontaneous formation of nanoparticle strip patterns through dewetting. nature Materials vol. 4, p. 896 (2005).
Hulteen, et al. nanosphere lithography: A materials general fabrication process for periodic particle array surfaces, J. Vac. Sci. Technol. 1995, 13: 1553-1558.
Humphrey, et al. Reversible thermoelectric nanomaterials. Physical Review Letters 94, 096601 (2005).
Husain, et al. nanowire-based very-high-frequency electromechanical resonator. Applied physics letters, vol. 83, No. 6, Aug. 11, 2003, pp. 1240-1242.
Ihab, et al. Manipulation of thermal phonons: a phononic crystal route to high-ZT thermoelectrics. Photonic and Phononic Properties of Engineered nanostructures, SPIE. 1000 20th St. Bellingham, WA 98225-6705. Feb. 10, 2011; 7946:1-9.
International search report and written opinion dated Feb. 9, 2009 for PCT/US2008/070309.
International search report and written opinion dated Apr. 15, 2009 for PCT/US2008/064439.
International search report and written opinion dated May 29, 2012 for PCT/US2011/057171.
International search report and written opinion dated Jul. 17, 2012 for PCT Application No. PCT/US2012/047021.
International search report and written opinion dated Dec. 27, 2013 for PCT/US2013/055462.
International search report dated Feb. 10, 2014 for PCT/US2013/067346.
Joannopoulos, et al. Photonic crystals: putting a new twist on light, nature 1997, 386: 143-149.
Jung, et al. Circuit Fabrication at 17 nm Half-Pitch by nanoimprint-tithography. nanoLetters, 6, 351 (2006).
Koga, et al. Experimental proof-of-principle investigation of enhanced Z3DT in (100) oriented Si/Ge superlattices. Applied Physics Letters 77, 1490-1492 (2000).
Lee, et al nanoporous Si as an Efficient Thermoelectric Material. nano Letter, 8, 2008, 3750-3754.
Lee, et al. Enhanced thermoelectric figure-of-merit in nanostructured p-type silicon germanium bulk alloys. nano. Lett. 2008; 8(12):4670-4674.
Lee, et al. nanostructured bulk thermoelectric materials and their properties. ICT 2005. 24th International Conference on Thermoelectrics (ICT). 2005 284-287.
Li, et al. Measuring thermal and thermoelectric properties of one-dimensional nanostructures using a microfabricated device. Journal of heart transfer, vol. 125, pp. 881-888, Oct. 2003.
Li, et al. Thermal conductivity of individual silicon nanowires. Applied Physics Letters, vol. 83, pp. 2934-2936, Oct. 6, 2003.
Lifshitz, et al. Thermoelastic damping in micro- and nanomechanical systems. Physical Review B 61, 5600-5609 (2000).
Liu, et al. Thermal conduction in ultrahigh pure and doped single-crystal silicon layers at high temperatures. Journal of Applied Physics 98, 123523 (2005).
Llaguno, et al. Observation of thermopower oscillations in the coulomb blockade regime in a semiconducting carbon nanotube. nano Lett. 4, 45-49 (2004).
Mahan, et al. The best thermoelectric. PnAS 93, 7436-7439 (1996).
Mahan, et al. Thermoelectric materials: new approaches to an old problem. Physics Today 50, pp. 42-47, Mar. 1997.
Majumdar. Thermoelectricity in Semiconductor nanostructures. Science Feb. 6, 2004; 303(5659):777-778. DOI: 10.1126/science.1093164.
Maranganti, et al. Length scales at which classical elasticity breaks down for various materials. Physical Review Letters 98, 195504 (2007).
Martin. nanomaterials—A membrane based synthetic approach. Science, v. 266, p. 1961-1966 (Dec. 23 1994).
Melosh, et al. Ultra-high density nanowire lattices and circuits. Science, vol. 300, pp. 112-115,Apr. 4, 2003.
Morales, et al. A laser ablation method for the synthesis of semiconductor crystalline nanowires. Science, vol. 279, pp. 208-211, Jan. 9, 1998.
NDT Resource Center, Thermal Conductivity. Downloaded Nov. 26, 2013. https://www.nde-ed.org/EducationResources/CommunityCollege/Materials/Physical_Chemical/ThermalConductivity.htm.
Notice of allowance dated Jul. 13, 2011 for U.S. Appl. No. 12/125,043.
Notice of allowance dated Oct. 2, 2013 for U.S. Appl. No. 12/125,043.

(56) References Cited

OTHER PUBLICATIONS

Office action dated Jan. 9, 2015 for U.S. Appl. No. 12/175,027.
Office action dated Jan. 23, 2015 for U.S. Appl. No. 13/278,074.
Office action dated Feb. 12, 2015 for U.S. Appl. No. 13/550,424.
Office action dated Feb. 18, 2011 for U.S. Appl. No. 12/125,043.
Office action dated Apr. 25, 2013 for U.S. Appl. No. 13/278,074.
Office action dated May 23, 2013 for U.S. Appl. No. 12/175,027.
Office action dated Jun. 22, 2011 for U.S. Appl. No. 12/175,027.
Office action dated Jun. 30, 2014 for U.S. Appl. No. 12/175,027.
Office action dated Jul. 18, 2014 for U.S. Appl. No. 13/278,074.
Office action dated Aug. 7, 2013 for U.S. Appl. No. 13/278,074.
Office action dated Nov. 10, 2010 for U.S. Appl. No. 12/175,027.
Office action dated Nov. 27, 2013 for U.S. Appl. No. 12/175,027.
Pearson. Survey of thermoelectric studies of the group-1 metals at low temperatures carried out at the national-research-laboratories, Ottawa. Soviet Physics-Solid State 3, 1024-1033 (1961).
Peng, et al. Ordered silicon nanowire'arrays via nanosphere lithography and metal induced etching. Applied Physics Letters, v.90, article # 163123 (2007).
Prasher. Thermal conductivity of composites of aligned nanoscale and microscale wires and pores. Journal of Applied Physics, 100, 034307, 2006, p. 1-9.
Qiu, et al. Large complete band gap in two-dimensional photonic crystals with elliptic air holes, Physical Review B 1999, 60: 10 610-10 612.
Routkevitch, et al. Electrochemical Fabrication of CdS nanowires arrays in porous anodic aluminum oxide templates. The Journal of Physical Chemistry, v. 100, p. 14037-14047 (1996).
She, et al. Fabrication of vertically aligned Si nanowires and their application in a gated field emission device. Applied Physics Letters. v; 88. article # 013112 (2006).
Sialon Ceramics. Downloaded May 6, 2013. http://www.sailon.com.au/high-temperature-seebeck-probes.htm.
Small, et al. Modulation of thermoelectric power of individual carbon nanotubes. Physical Review letters, vol. 91, pp. 256801-1 to 256801-4, 2003.
Snyder, et al. Thermoelectric microdevice fabricated by a MEMS-like electrochemical process. nature Material, vol. 2, pp. 528-531, Aug. 2003.
Tang, et al. Holey silicon as an efficient thermoelectric material. nano. Lett. 2010; 10:4279-4283.
Tao, et al. Langrfluir Blodgett Silver nanowire Monolayers for Molecular Sensing Using Surface-Enhanced Raman Spectroscopy. nanoLetters 3, 1229 (2003).
Trzcinski, et al. Quenched Phonon Drag in Silicon Microcontacts. Physical Review Letters, vol. 56, No. 10, pp. 1086-1089, 1986.
Unpublished U.S. Appl. No. 14/624,506, filed Feb. 17, 2015.
Unpublished U.S. Appl. No. 14/667,177, filed Mar. 24, 2015.
Vekatasubramanian, et al. Thin-film thermoelectric devices with high room-temperature figures of merit. nature, vol. 413, pp. 597-602, Oct. 11, 2001.
Vining. Desperately seeking silicon. nature, vol. 451, pp. 132-133, Jan. 10, 2008.
Vossmeyer, et al. Light-directed assembly of nanoparticles, Angew. Chem. Int. Ed. Engl. 1997, 36: 1080-1083.
Wang, et al. A new type of lower power thermoelectric microgenerator fabricated by nanowire array thermoelectric material. Microelectronic Engineering. 2005; 77:223-229.
Wang, et al. Complementary Symmetry Silicon nanowire Logic: Power-Efficient Inverters with Gain**, Small 2006, 2: 1153-1158.
Wang, et al. Oxidation Resistant Germanium nanowires:. Bulk. Synthesis. Long Chain Alkahethioi Functionalization, and Langmuir-Blodgett Assembly. Journal of the American Chemical Society, 127, 11871 (2005).
Wang, et al. Surface Chemistry and Electrical Properties of Germanium nanowires, JACS 2004, 126: 11602-11611.
Wang, et al. Use of phopshine as an n-type dopant source for vapor-liquid-solid growth of silicon nanowires. nano Letters. 2005; 5(11):2139-2143.
Wang, et al., Silicon p-FETs from Ultrahigh Density nanowire Arrays, nano Letters 2006, 6: 1096-1100.
Weber, et al. Silicon-nanowire transistors with Intruded nickel-Silicide Contacts. nano Letters v. 6, p. 2660-2666 (2006).
Weber, et al. Transport properties of silicon. Applied Physics A: Solids and Surfaces, pp. 136-140, 1991.
Whang, et al. Large-Scale Hierarchical Organization of nanowire Arrays for Integrated nanosystems. nanoLetters 3, 1255-1259 (2003).
Williams, et al. Etch rates for micromachining processing. Journal of Microelectromechanical Systems 5, 256-269 (1996).
Wu, et al. Single-crystal metallic nanowires and meta semiconductor nanowires heterostructures. nature, 430. p. 61'(2004).
Xu, et al. Controlled fabrication of long quasione-dimensional superconducting nanowire arrays. nano letters, vol. 8, No. 1, Dec. 6, 2007, pp. 136-141.
Yablonovitch. Photonic band-gap structures, J. Opt. Soc. Am. B. 1993, 10: 283-297.
Yang, et al. Encoding Electronic Properties.by Synthesis of Axial Modulation Doped Silicon nanowires. Science, 310, p. 1304 (2005).
Yang, et al. Single p-Type/Intrinsic/n-TypeSilicon nanowires as nanoscale Avalanche Photodetectors, nano Letters 2006, 6: 2929-2934.
Yang, et al. Thermal conductivity of simple and tubular nanowire composites in the longitudinal direction. Physiucal Review B, 72, 125418, 2005, p. 1-7.
Yu-Ming, et al. Semimetal-semiconductor transition in bil_xSbx alloy nanowires and their thermoelectric properties. Applied Physics Letter, Volov. 81, No. 13, pp. 2403-2405, Sep. 23, 2002.
Zener, et al. Internal friction in solids III. Experimental demonstration of thermoelastic internal friction. Physical Review 53, 100-101 (1938).
Zener. Internal friction in solids I. Theory of internal friction in reeds. Physical Review 52, 230-235 (1937).
Zhong, et al. nanowire Crossbar Arrays as Address Decoders for Integrated nanosystems, Science 2003, 302: 1377-1379.
Zhou, et al. Verticaly aligned Zn2SiO4 nanotube/ZnO nanowire Heterojunction Arrays. Small, v.3. p. 622-626 (2007).
Zhou. Determination of transport properties in chromium disilicide nanowires via combined thermoelectric and structural characterizations. nano Letters 7, 1649-1654 (2007).
Notice of allowance dated Oct. 8, 2015 for U.S. Appl. No. 14/667,177.
Office action dated Aug. 28, 2015 for U.S. Appl. No. 13/550,424.
Boukai. Thermoelectric properties of bismuth and silicon nanowires. Dissertation (Ph.D.), California Institute of Technology. 2008.
Huang, et al. Metal-assisted chemical etching of silicon: a review. Adv Mater. Jan. 11, 2011;23(2):285-308. doi: 10.1002/adma.201001784.
International search report and written opinion dated Apr. 26, 2013 for PCT/US2013/021900.
Yu, et al. Reduction of thermal conductivity in phononic nanomesh structures. Nature Nanotechnology. 2010; 5:718-721.
U.S. Appl. No. 14/700,082, filed Apr. 29, 2015, Boukai et al.
International search report and written opinion dated Jul. 3, 2015 for PCT Application No. US2015/022312.
Notice of allowance dated Jul. 29, 2015 for U.S. Appl. No. 12/175,027.
Office action dated Jun. 16, 2015 for U.S. Appl. No. 13/278,074.
Silverstein, et al. Porous polymers. John Wiley & Sons, 2011.
"Chen, et al. Dispenser Printed Microscale Thermoelectric Generators for Powering Wireless Sensor Networks. Paper No. IMECE2009-11636, pp. 343-352; 10 pages."
Co-pending U.S. Appl. No. 14/989,225, filed Jan. 6, 2016.
European search report and opinion dated Feb. 26, 2016 for EP Application No. 13829134.9.
"Notice of allowance dated Jan. 22, 2016 for U.S. Appl. No. 14/667,177."
"Notice of allowance dated Dec. 10, 2015 for U.S. Appl. No. 14/667,177."
Notice of allowance dated Nov. 6, 2015 for U.S. Appl. No. 14/667,177.
Office action dated Nov. 18, 2015 for U.S. Appl. No. 13/278,074.
Office action dated Oct. 7, 2016 for U.S. Appl. No. 14/989,225.
Notice of allowance dated Jul. 29, 2016 for U.S. Appl. No. 14/624,506.
Notice of allowance dated Jun. 15, 2016 for U.S. Appl. No. 13/278,074.

(56) References Cited

OTHER PUBLICATIONS

Office action dated Jun. 28, 2016 for U.S. Appl. No. 14/624,506.
Office action dated Jun. 29, 2016 for U.S. Appl. No. 13/550,424.
Sialon Ceramics. Downloaded May 6, 2013. http://www.sialon.com.au/high-temperature-seebeck-probes.htm.
Office action dated Jun. 26, 2017 for U.S. Appl. No. 14/989,225.

* cited by examiner

SYSTEMS AND METHODS FOR FORMING THERMOELECTRIC DEVICES

CROSS-REFERENCE

This application claims priority to Patent Cooperation treaty (PCT) Patent Application No. PCT/US2013/021900, filed Jan. 17, 2012, which claims priority to U.S. Provisional Patent Application No. 61/587,607, filed Jan. 17, 2012, and U.S. Provisional Patent Application No. 61/620,920, filed Apr. 5, 2012, which are entirely incorporated herein by reference.

BACKGROUND

Over 15 Terawatts of heat is lost to the environment annually around the world by heat engines that require petroleum as their primary fuel source. This is because these engines only convert about 30 to 40% of petroleum's chemical energy into useful work. Waste heat generation is an unavoidable consequence of the second law of thermodynamics.

The term "thermoelectric effect" encompasses the Seebeck effect, Peltier effect and Thomson effect. Solid-state cooling and power generation based on thermoelectric effects typically employ the Seebeck effect or Peltier effect for power generation and heat pumping. The utility of such conventional thermoelectric devices is, however, typically limited by their low coefficient-of-performance (COP) (for refrigeration applications) or low efficiency (for power generation applications).

Thermoelectric device performance may be captured by a so-called thermoelectric figure-of-merit, $Z=S^2 \sigma/k$, where 'S' is the Seebeck coefficient, 'σ' is the electrical conductivity, and 'k' is thermal conductivity. Z is typically employed as the indicator of the COP and the efficiency of thermoelectric devices—that is, COP scales with Z. In some cases, a dimensionless figure-of-merit, ZT, is employed, where 'T' can be an average temperature of the hot and the cold sides of the device.

Applications of conventional semiconductor thermoelectric coolers are rather limited, as a result of a low figure-of-merit, despite many advantages that they provide over other refrigeration technologies. In cooling, low efficiency of thermoelectric devices made from conventional thermoelectric materials with a small figure-of-merit limits their applications in providing efficient thermoelectric cooling.

SUMMARY

Recognized herein is a need for enhanced thermoelectric materials and systems and methods for their fabrication.

In some embodiments, a thermoelectric device comprises a semiconductor substrate having a mesh (e.g., a plurality of holes) disposed between electrodes of the thermoelectric device. Holes included in the mesh can have dimensions on the order of nanometers to micrometers. In some cases, the holes can be filled with a metallic material, semiconductor, or insulator to provide inclusions. The inclusions can have dimensions on the order of nanometers to micrometers.

In some situations, thermoelectric device performance can be dependent on the uniformity of holes defining a mesh. Mesh uniformity can depend, at least in part, on the method used to form the mesh. Provided herein are systems and methods for enabling the formation of a uniform mesh.

In some cases, a thermoelectric device is provided having a semiconductor substrate and an array of nanostructures, such as wires (or nanowires) or holes. The nanostructures can have a high aspect ratio, such as at least 10:1, 100:1, 1000:1, 10,000:1, 100, 000:1, 1,000,000:1, or higher, and can be monodisperse. In some cases, the nanostructures are anchored to a semiconductor substrate, such as a silicon substrate.

An aspect of the present disclosure provides a method for forming a thermoelectric device, comprising providing a mask adjacent to a substrate, the mask comprising a polymeric mixture, and bringing a template having a first pattern in contact with the mask to define a second pattern in the mask. The first pattern comprises one of holes and rods, the second pattern comprises the other of holes and rods, and holes or rods of the second pattern expose portions of the substrate. Such exposed portions of the substrate can directly expose the substrate, or expose a layer that is adjacent to the substrate. Next, an etching layer can be deposited adjacent to exposed portions of the substrate. The etching layer is configured to aid in etching the substrate. The substrate can then be etched with the aid of the etching layer.

Another aspect of the present disclosure provides a method for forming a thermoelectric element for use in a thermoelectric device. The method comprises providing a polymeric mixture adjacent to a substrate, and translating the substrate in relation to a heat source, or vice versa, to form a transformed film along a direction anti-parallel to the direction of motion of the substrate in relation to the heat source. The polymeric mixture comprises a first polymeric material and a second polymeric material. The transformed film comprises three-dimensional structures phase-separated in a polymer matrix. Next, the three-dimensional structures or the polymer matrix can be removed to expose portions of the substrate. An etching layer can then be deposited adjacent to exposed portions of the substrate. The etching layer is configured to aid in etching the substrate. With the aid of the etching layer, the substrate can be catalytically etched with an oxidizing agent and an etchant.

In another aspect of the present disclosure, a thermoelectric device comprises an n-type semiconductor element comprising a periodic array of holes or wires and a p-type semiconductor element that is adjacent to the n-type semiconductor element. An individual hole or wire of the periodic array has an aspect ratio of at least about 100-to-1. The p-type semiconductor element comprises a periodic array of holes or wires. An individual hole or wire of the periodic array has an aspect ratio of at least about 100-to-1.

Another aspect of the present disclosure provides a method for forming a thermoelectric device, comprising providing, in a reaction chamber, a mixture comprising a first solid state material and a second solid state material, and heating the mixture to a temperature that is at or above a eutectic temperature of an alloy comprising the first solid state material and the second solid state material, thereby forming one or more domains of the alloy. The mixture can then be cooled to a temperature that is below the eutectic temperature to provide the alloy phase separated in a matrix comprising the first solid state material or the second solid state material. The alloy can then be selectively removed (e.g., etched) in relation to the matrix to yield one or more inclusions in the matrix.

In another aspect of the present disclosure, a method for forming a thermoelectric device comprises immersing at least a portion of a substrate in a solution comprising an emulsion of metallic particles, and removing the immersed portion of the substrate from the solution to provide at least a subset of the metallic particles disposed adjacent to the substrate. The subset of the metallic particles can be comprised in a pattern of metallic particles. Holes or rods can then be formed in the substrate with the aid of the metallic particles. The holes or rods are comprised in a pattern of holes or rods that corresponds to the pattern of metallic particles.

Another aspect of the present disclosure provides a method for forming a thermoelectric device, comprising providing a photoresist adjacent to a substrate, exposing at least a portion of the photoresist to electromagnetic radiation, and removing the at least the portion of the photoresist that has been exposed to electromagnetic radiation to provide a pattern of holes in the photoresist. The holes expose portions of the substrate. Next, an etching layer can be deposited adjacent to the substrate, wherein the etching layer is configured to aid in etching the substrate, and the substrate can be etched with the aid of the etching layer to form holes in or rods from the substrate.

Another aspect of the present disclosure provides a thermoelectric device comprising a first thermoelectric element formed of an n-type semiconductor substrate and a second thermoelectric element that is adjacent to the first thermoelectric element and electrically coupled to the first thermoelectric element. The second thermoelectric element can be formed of a p-type semiconductor substrate. The semiconductor substrate of each of the first and second thermoelectric elements can comprise a substantially periodic pattern of holes or wires, wherein an individual hole or wire of the pattern has an aspect of ratio of at least about 20:1 and a surface roughness between about 0.5 nanometers (nm) and 50 nm, which may be measured by transmission electron microscopy (TEM).

Additional aspects and advantages of the present disclosure will become readily apparent to those skilled in this art from the following detailed description, wherein only illustrative embodiments of the present disclosure are shown and described. As will be realized, the present disclosure is capable of other and different embodiments, and its several details are capable of modifications in various obvious respects, all without departing from the disclosure. Accordingly, the drawings and description are to be regarded as illustrative in nature, and not as restrictive.

INCORPORATION BY REFERENCE

All publications, patents, and patent applications mentioned in this specification are herein incorporated by reference to the same extent as if each individual publication, patent, or patent application was specifically and individually indicated to be incorporated by reference.

BRIEF DESCRIPTION OF THE DRAWINGS

The novel features of the invention(s) are set forth with particularity in the appended claims. A better understanding of the features and advantages of the present invention(s) will be obtained by reference to the following detailed description that sets forth illustrative embodiments, in which the principles of the invention(s) are utilized, and the accompanying drawings (also "FIG." and "FIGS." herein), of which:

DETAILED DESCRIPTION

While various embodiments of the invention(s) of the present disclosure have been shown and described herein, it will be obvious to those skilled in the art that such embodiments are provided by way of example only. Numerous variations, changes, and substitutions may occur to those skilled in the art without departing from the invention(s). It should be understood that various alternatives to the embodiments of the invention(s) described herein may be employed in practicing any one of the inventions(s) set forth herein.

The term "nanostructure," as used herein, refers to structures having a first dimension (e.g., width) along a first axis that is less than about 1 micrometer ("micron") in size. Along a second axis orthogonal to the first axis, such nanostructures can have a second dimension from nanometers or smaller to microns, millimeters or larger. In some cases, the dimension (e.g., width) is less than about 1000 nanometers ("nm"), or 500 nm, or 100 nm, or 50 nm, or smaller. Nanostructures can include holes formed in a substrate material. The holes can form a mesh having an array of holes. In other cases, nanostructure can include rod-like structures, such as wires, cylinders or box-like structure. The rod-like structures can have circular, elliptical, triangular, square, rectangular, pentagonal, hexagonal, heptagonal, octagonal or nonagonal, or other cross-sections.

The term "nanohole," as used herein, refers to a hole, filled or unfilled, having a width or diameter less than about 1000 nanometers ("nm"), or 500 nm, or 100 nm, or 50 nm, or smaller. A nanohole filled with a metallic, semiconductor, or insulating material can be referred to as a "nanoinclusion."

The term "n-type," as used herein, refers to a material that is chemically doped ("doped") with an n-type dopant. For instance, silicon can be doped n-type using phosphorous or arsenic.

The term "p-type," as used herein, refers to a material that is doped with an p-type dopant. For instance, silicon can be doped p-type using boron or aluminum.

Provided herein are systems and methods for forming thermoelectric devices. Some embodiments provide thermoelectric devices having electrodes, each electrode having an array of holes. The array of holes is formed by transferring a pattern provided in a template to a substrate adjacent to the template to form a thermoelectric element having an array of nano structures. The array of nano structures can include a plurality of holes or elongate structures, such as wires (e.g., nanowires).

In some embodiments, systems and methods are provided for forming the pattern of holes with the aid of a mask having a uniform pattern of holes.

Figure 1:
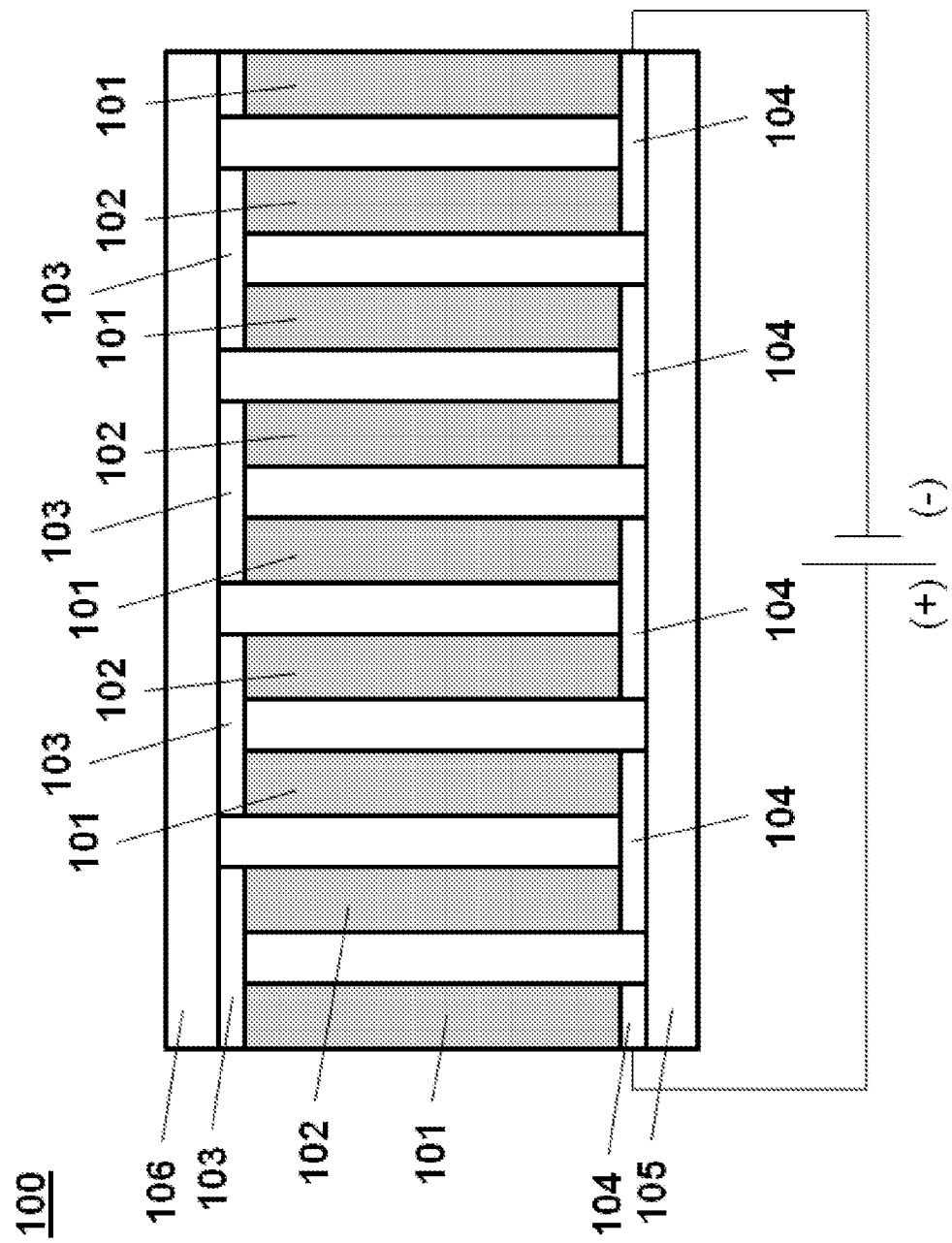
FIG. 1 shows a thermoelectric device.

FIG. 1 shows a thermoelectric device 100, in accordance with various embodiments of the disclosure. The thermoelectric device 100 includes n-type 101 and p-type 102 elements disposed between a first set of electrodes 103 and a second set of electrodes 104 of the thermoelectric device 100. The first set of electrodes 103 connects adjacent n-type 101 and p-type elements, as illustrated.

The electrodes 103 and 104 are in contact with a hot side material 105 and a cold side material 106 respectively. In some embodiments, the hot side material 105 and cold side material 106 are electrically insulating but thermally conductive. The application of an electrical potential to the electrodes 103 and 104 leads to the flow of electrical current (also "current" herein), which generates a temperature gradient ($\Delta T$) across the thermoelectric device 100. The temperature gradient ($\Delta T$) extends from a first temperature (average), T1, at the hot side material 105 to a second temperature (average), T2, at the cold side material 106, where T1>T2. The temperature gradient can be used for heating and cooling purposes.

The n-type 101 and p-type 102 elements of the thermoelectric device 100 can be formed of structures having dimensions from nanometers to micrometers, such as, e.g., nanostructures. In some situations, the nanostructures are holes or inclusions, which can be provided in an array of holes (i.e., mesh). In other situations, the nanostructures are rod-like structures, such as nanowires. In some cases, the rod-like structures are laterally separated from one another.

In some cases, the n-type 101 and/or p-type 102 elements are formed of an array of wires or holes oriented along the direction of the temperature gradient. That is, the wires extend from the first set of electrodes 103 to the second set of electrodes 104. In other cases, the n-type 101 and/or p-type 102 elements are formed of an array of holes oriented along a direction that is angled between about 0° and 90° in relation to the temperature gradient. In an example, the array of holes is orthogonal to the temperature gradient. The holes or wires, in some cases, have dimensions on the order of nanometers to micrometers. In some cases, holes can define a nanomesh.

Thermoelectric devices of the present disclosure, such as the device 100 of FIG. 1, can have various advantages of other thermoelectric devices present available, such as, for example, improved cooling and/or heating. In some examples, a thermoelectric device formed according to methods of the disclosure may provide a hot side to cold side temperature difference ($\Delta T$) of at least about 5° C., 10° C., 15° C., 20° C., 30° C., 40° C., or 50° C. at an applied current of about 350 mA. In an example, a $\Delta T$ of about 26° C. can be provided at an applied current of about 350 mA. In some examples, a thermoelectric device formed according to methods of the disclosure may provide a $\Delta T$ of at least about 5° C., 10° C., 15° C., 20° C., 30° C. at an applied current of about 350 mA. In an example, a $\Delta T$ of about 15° C. can be provided at an applied current of about 300 mA.

In some embodiments, holes can be formed, or wires can be formed from, a substrate. In some cases, the methods comprise defining, with the aid of a metallic material, a pattern to be transferred to the substrate, and with the aid of the metallic material catalytically etching the substrate to define the pattern in the substrate.

In some embodiments, a method for forming a thermoelectric device having a plurality of holes comprises forming a pattern of holes or wires in a mask, and transferring the pattern of holes or wires to a substrate to form holes or wires in the substrate. A pattern of holes can comprise one or more holes, and a pattern of wires (or rods) can comprise one or more wires (or rods). Methods for forming masks having a pattern of holes or wires are provided in U.S. patent application Ser. No. 13/550,424 to Boukai et al. ("THERMOELECTRIC DEVICES, SYSTEMS AND METHODS"), which is entirely incorporated herein by reference.

In some embodiments, a method for forming a thermoelectric device having a plurality of holes comprises forming a mask adjacent to a substrate, the mask having three-dimensional structures phase-separated in a polymer matrix. The substrate can be a semiconductor substrate, such as a silicon substrate. The mask is formed by providing a polymeric mixture having a first polymeric material and a second polymeric material adjacent to the substrate, and spin coating the polymeric mixture over the substrate. Next, the polymeric mixture is thermally annealed. The polymeric mixture phase separates into domains of three-dimensional structures (e.g., cylindrical structures) that define a pattern. The three-dimensional structures are disposed in a polymeric matrix having the first polymeric material. Next, an array (or pattern) of holes is formed in the substrate by etching the three-dimensional structures to reveal the substrate, and catalytically transferring the array to the substrate to provide an array of holes (or inclusions) in the substrate.

Alternatively, to form an array of wires (or rods) from the substrate, the polymeric matrix is etched to provide an array of three-dimensional structures over the substrate. A pattern defined by the array of three-dimensional structures is then catalytically transferred to the substrate to provide an array of wires formed from the substrate. As another alternative, to form an array of wires (or rods) from the substrate, the three-dimensional structures can be etched to reveal the substrate. A first metallic material is deposited on the polymeric matrix, including the holes formed in the polymeric matrix. The polymeric matrix is then removed, leaving an array of the first metallic material over the semiconductor surface. The array of the first metallic material defines a pattern. A second metallic material is then deposited on the semiconductor substrate. The first metallic material serves as a mask to limit or prevent etching of the semiconductor substrate that is facilitated by the second metallic material. A pattern defined by the array of the first metallic material is then catalytically transferred to the substrate to provide an array of wires formed from the semiconductor substrate.

In some cases, a template is formed of a copolymer (e.g., block copolymer). In an example, a template is formed by providing a block copolymer and forming an array of cylinders in the block copolymer to define the template.

In some embodiments, a template (or mask) is formed of a first polymeric material and the three-dimensional structures defining a pattern are formed of a second polymeric material. The second polymeric material is embedded in a polymeric matrix comprising the first and second polymeric materials. In some embodiments, the polymeric matrix comprises a block copolymer having the first polymeric material and the second polymeric material. The polymeric matrix can include a multi-block copolymer, such as a di-block copolymer, tri-block copolymer or tetra-block copolymer. In other embodiments, the polymeric matrix comprises homo polymers of the first and second polymeric materials.

In some cases, the first polymeric material can be formed of a material having a molecular weight of at least about 1 kilodalton (kDa), or 2 kDa, or 3 kDa, or 4 kDa, or 5 kDa, or 6 kDa, or 7 kDa, or 8 kDa, or 9 kDa, or 10 kDa, or 20 kDa, or 30 kDa, or 40 kDa, or 50 kDa, or 100 kDa, or 200 kDa, or more. In some situations, the first polymeric material has a molecular weight between about 10 kDa and 80 kDa, or 20 kDa and 60 kDa, or 30 kDa and 50 kDa. In some embodiments, the first polymeric material is polystyrene.

In some cases, the second polymeric material can be formed of a material having a molecular weight of at least about 1 kDa, or 2 kDa, or 3 kDa, or 4 kDa, or 5 kDa, or 6 kDa, or 7 kDa, or 8 kDa, or 9 kDa, or 10 kDa, or 20 kDa, or 30 kDa, or 40 kDa, or 50 kDa, or 100 kDa, or more. In some situations, the second polymeric material has a molecular weight between about 5 kDa and 40 kDa, or 10 kDa and 30 kDa, or 15 kDa and 25 kDa. In some embodiments, the second polymeric material is a block copolymer. In some cases, the second polymeric material can be selected from poly(methyl methacrylate) (PMMA), poly(dimethylsiloxane) (PDMS), poly(ethylene oxide) (PEO), poly(4-vinylpyridine) (P4VP), poly(2-vinylpyridine) (P2VP), poly(styrene-b-dimethylsiloxane) (PS-b-PDMS), poly(styrene-b-ethylene oxide) (PS-b-PEO), poly(styrene-b-4-vinylpyridine) (PS-b-P4VP), poly(styrene-block-2-vinylpyridine) (PS-b-P2VP), or mixtures thereof.

The second polymeric material can be removed with the aid of an etching chemistry that can be selected based on the material comprising the second polymeric material and, in some cases, the first polymeric material. For example, a second polymeric material formed of PDMS can be etched using hydrogen fluoride. As another example, a second polymeric material formed of PEO can be etched using hydrogen iodide. As another example, PMMA can be etched using acetic acid. Etching chemistries for various polymeric materials can be found at, for example, Silverstein, M. S., Cameron, N. R., & Hillmyer, M. A. (2011), *Porous Polymers*, New Jersey John Wiley & Sons, Inc., which is entirely incorporated herein by reference.

The template can be used to form a pattern of holes or rod-like structures. An array of holes can be formed in the substrate by providing a metallic material in the holes of the template to define an array of particles (e.g., nanoparticles) adjacent to the substrate. With the aid of the metallic material, the substrate can be etched to form a thermoelectric element having an array of holes. Alternatively, an array of rod-like structure can be formed from the substrate by etching, with the aid of a metallic material, the substrate relative to metallic particles adjacent to the substrate to form a thermoelectric element having an array of rods (or wires).

A pattern of holes or wires in a thermoelectric element can have a pitch (e.g., center to center distance from adjacent holes or wires) that is less than or equal to about 5000 nanometers (nm), or 1000 nm, or 500 nm, or 400 nm, or 300 nm, or 200 nm, or 100 nm, or 50 nm, or 40 nm, or 30 nm, or 20 nm, or 15 nm, or 10 nm, or 5 nm, or less. An exposed surface of a hole or wire can have a surface roughness that is suitable for optimized thermoelectric device performance. In some cases, the root mean square roughness of a hole or wire is between about 0.1 nm and 50 nm, 0.5 nm and 50 nm, or 1 nm and 20 nm, or 1 nm and 10 nm. The roughness can be determined by transmission electron microscopy (TEM) or other surface analytical technique, such as atomic force microscopy (AFM) or scanning tunneling microscopy (STM). The surface roughness may be characterized by a surface corrugation.

An individual hole or wire can have an aspect ratio (e.g., the length of a thermoeletric element divided by the width of an individual hole or wire) of at least about 1.5:1, 2:1, 5:1, 10:1, 50:1, 100:1, 1000:1, 5000:1, 10, 000:1, 100,000:1, 1,000,000:1, 10,000,000:1, or 100,000,000:1.

Holes or wires in an array of holes or wires can be substantially monodisperse. Monodisperse holes or wires may have substantially the same size, shape and/or distribution (e.g., cross-sectional distribution). As an alternative, the holes or wires can be distributed in domains of holes or wires of various sizes, such that the holes or wires are not necessarily monodisperse. For example, the holes or wires can be polydisperse.

Systems and Methods for Forming Thermoelectric Elements

An aspect of the disclosure provides systems and methods for forming elements thermoelectric elements. In some embodiments, the systems and methods include thermal annealing systems for facilitating the formation of uniform templates (or masks) for use in forming the electrodes.

Figure 2A:
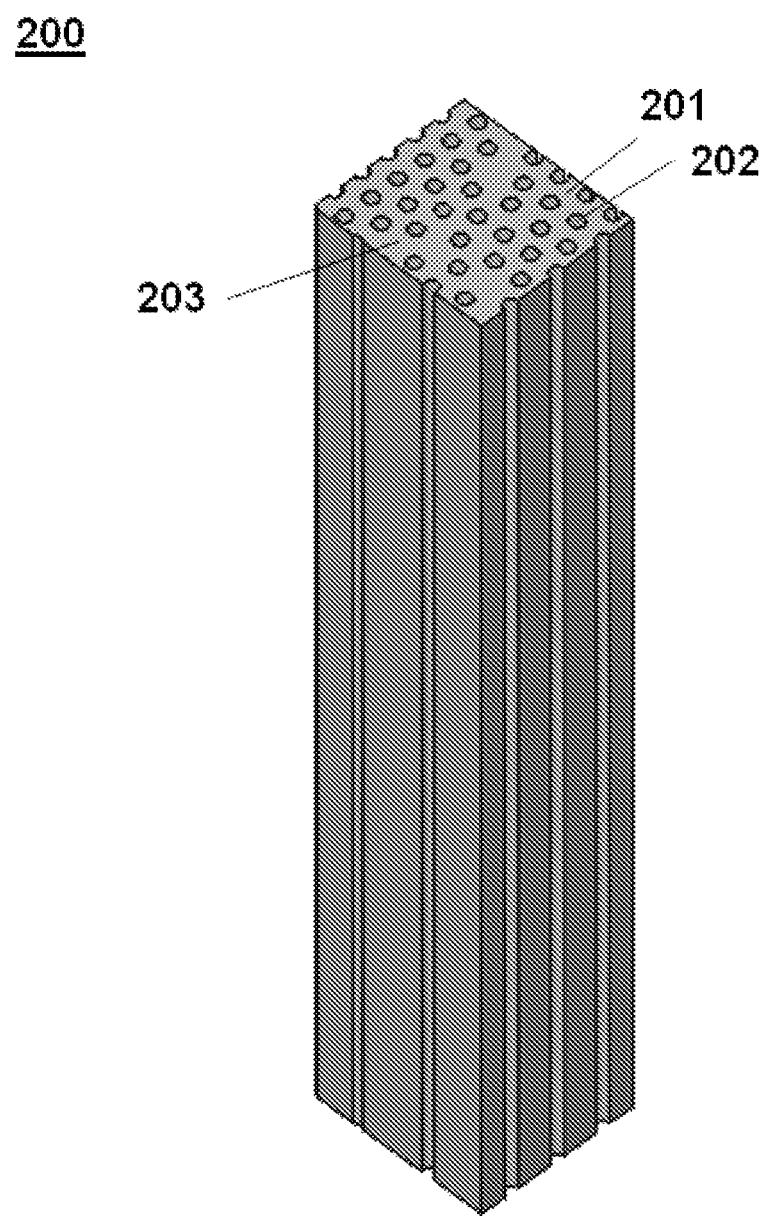
FIGS. 2A and 2B schematically illustrate a thermoelectric element having periodic and non-periodic domains of holes (or inclusions)
Figure 2B:
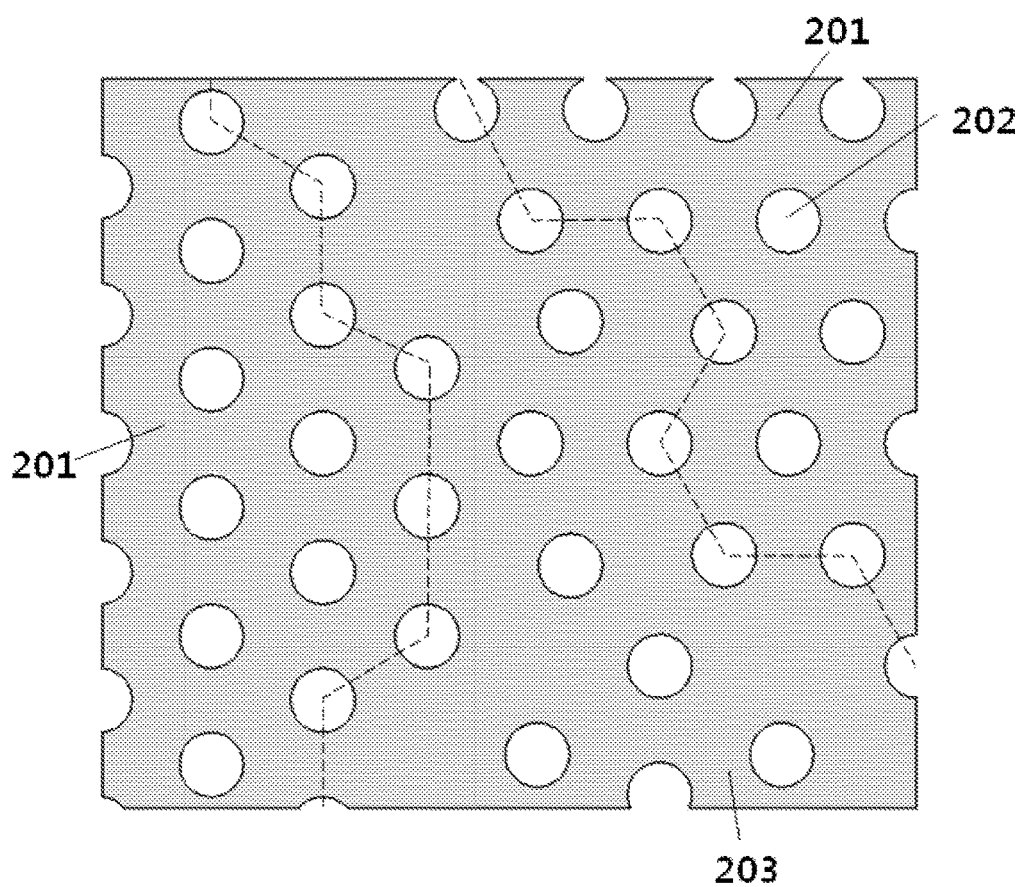

In some cases, a thermoelectric device can include an element with both periodic and non-periodic domains of features (e.g., holes, wires). FIGS. 2A and 2B schematically illustrate a thermoelectric element 200 having a hexagonal periodic domain 201 of holes (or inclusions) 202 and a non-periodic domain 203 of holes 202. The element 200 can be an n-type or p-type element, depending on whether n-type or p-type doping of a semiconductor substrate comprising the element 200 is employed. The periodic 201 and non-periodic 203 domains are marked by the dashed lines in FIG. 2A. The periodic 201 and non-periodic 203 domains are separated by domain boundaries that are marked by dashed lines.

The holes 202 in the periodic domain 201 can display long range order. The holes 202 in the non-periodic domain 203 may not display long range order. In some cases, the holes 202 in the non-periodic domain 203 do not display long range order.

Figure 3A:
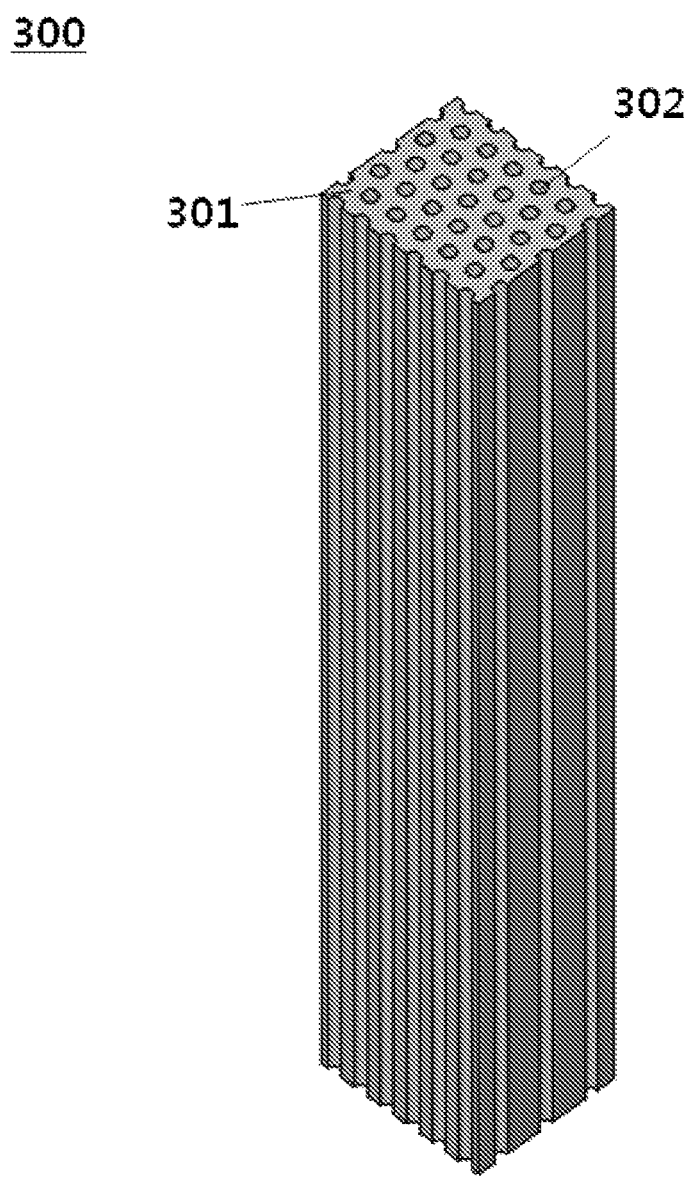
FIGS. 3A and 3B schematically illustrate a thermoelectric element having a periodic array of holes.
Figure 3B:
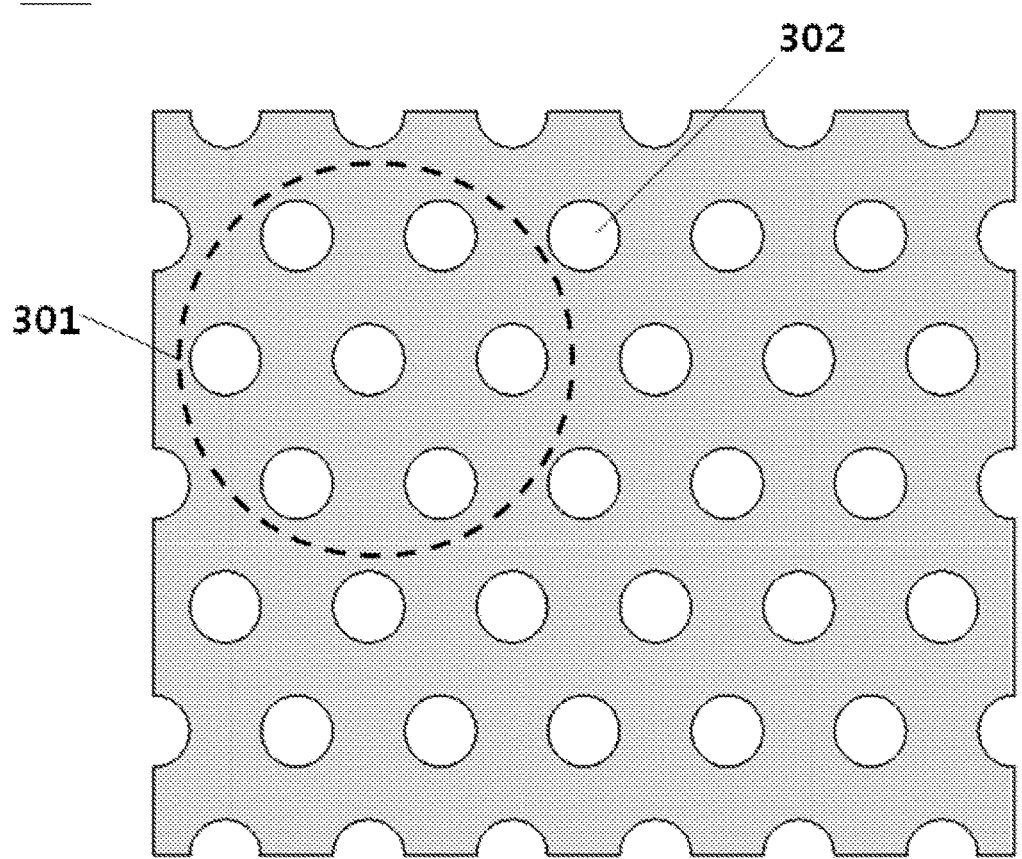

In other cases, a thermoelectric device can include an element with features (e.g., holes, wires) in a substantially periodic arrangement. FIGS. 3A and 3B schematically illustrate an element 300 with a periodic domain 301 of holes 302. Non-periodic domains can incorporate areas of highly thermally conductive bulk silicon that are parasitic conduction paths for heat. Periodic domains, such as close-packed periodic domains, can aid in minimizing these areas and reduce parasitic heat conduction, thereby aiding in improving thermoelectric device performance. Thus, in some situations, periodic domains may be preferable over non-periodic domains. However, in some cases, non-periodic domains may be preferable. For instance, when parasitic conduction paths of bulk silicon are minimized, non-periodic domains may be more effective than periodic domains at scattering a larger frequency range of phonons, reducing overall heat conduction beyond what periodic domains can achieve.

The holes 302 are in a hexagonal arrangement, but in other cases the holes can have other arrangements, such as triangular, square, rectangular, or pentagonal. The holes 302 in some cases have close packing arrangements, such as hexagonal close packing (hcp). The holes 302 in some cases can have packing arrangements that are non-periodic, such as in a quasiperiodic crystal. In an example, the holes 302 can be in a quasicrystalline arrangement having, for example, a triangular and/or pentagonal distribution of holes.

The periodic domain (or array) of holes can have an aspect ratio—thickness of the element 300 divided by the width (or diameter) of an individual hole of the holes 302—of at least about 2-to-1, or 5-to-1, or 10-to-1, or 100-to-1, or 1000-to-1, or 10,000-to-1, or 100,000-to-1, or 1,000,000-to-1, or more. The thickness of the element is taken along the direction of orientation of the holes 302.

In some embodiments, an element includes a periodic array of wires (e.g., cylinders). The periodic array of wires can have an aspect ratio—thickness of the element divided by the width (or diameter) of an individual wire—of at least about 2-to-1, or 5-to-1, or 10-to-1, or 100-to-1, or 1000-to-1, or 10,000-to-1, or 100,000-to-1, or 1,000,000-to-1, or more. The thickness of the element is taken along the direction of orientation of the wires.

Thermoelectric device performance can be at least in part dependent on the distribution of features (e.g., holes or wires) of elements of the thermoelectric device, such as, for example, the periodicity of features. The distribution of such features can in turn be at least in part dependent on the methods used to form the features.

In some embodiments, the distribution of features is dependent on the distribution of three-dimensional structures formed in masks overlying a substrate, which is used to form an element of a thermoelectric device. The distribution of three-dimensional structures (or features) can be based, at least in part, on the rate at which a polymer matrix is annealed to initiate a self-assembly process of block co-polymers in the polymer matrix, which is used to form a mask.

For instance, in some cases, semiconductor wafers are heated in an oven or on a hotplate, perhaps in presence of solvent vapor (solvent annealing), to start the block copolymer self-assembly process. This can produce self-assembled block copolymer films with multiple unaligned domains due to simultaneous nucleation and subsequent growth of domains. Individual domains can show highly periodic packing of three-dimensional structures (e.g., cylinders), but may not be aligned with each other, leading to periodic and non-periodic domains. This can lead to an element having periodic and non-periodic domains of features (e.g., holes), as shown in FIGS. 2A and 2B.

Some embodiments provide methods for regulating the distribution of features (e.g., holes, wires) of elements of thermoelectric devices. The distribution of features can be regulated by controlling the rate and manner in which masks are thermally annealed. Methods can be used to form elements in a batch-wise or continuous fashion, such as on a conveyor-type system. Methods provided herein can be used to form elements with features with periodic and non-periodic domains of features (e.g., holes, wires), or substantially periodic features.

In some cases, domain growth is substantially within a heated area of a polymeric material used to form a mask. In an example, a polymeric material is provided adjacent to a substrate (e.g., silicon) by spin coating. Next, a portion of the polymeric material is exposed to heat, such as, for example, by illumination from a heat lamp or by contact with a hot plate. The polymeric material within the heated portion self-assembles to form three-dimensional structures (e.g., cylinders) within a polymeric matrix. The three-dimensional structures are distributed in a periodic domain of the three-dimensional structures.

In some embodiments, a mask is formed by controlling or regulating one or more processing parameters used to form the mask. The processing parameters can be selected from the location where heat is applied to polymer (or polymeric) material, the length of time heat is applied, and the annealing temperature.

In some cases, exposing substantially all of a substrate to a heat source produces non-periodic domains, which may not be desirable, such as due to parasitic heat conduction. It has been recognized herein that by heating a substrate gradually along a predetermined direction, a higher density of periodic domains can be produced. Periodic domains can provide for less disorder, which can translate to an array of holes (or rods) that can provide for a thermoelectric device with minimized parasitic heat conduction.

A substrate can be heated by translating a substrate relative to a heat source. This can include moving the substrate towards or away from the heat source, moving the heat source towards or away from the substrate, or moving both the substrate and the heat source towards or away from one another. The substrate can be moved along a conveyor belt or with the aid of a robotic arm, for example. As another example, the substrate can be stationary, and the heat source can be moved towards the substrate with the aid of a linear track (see below).

The substrate can be moved towards the heat source at a linear velocity of at least about 0.001 m/s, 0.01 m/s, 0.1 m/s, 1 m/s, 5 m/s, 10 m/s, or 100 m/s. As an alternative, the heat source can be moved towards the substrate at a linear velocity of at least about 0.001 m/s, 0.01 m/s, 0.1 m/s, 1 m/s, 5 m/s, 10 m/s, or 100 m/s.

A substrate can be moved towards a heat source, or vice versa, continuously. As an alternative, a substrate can be moved towards a heat source, or vice versa, in a series of one or more steps, with each step including a period in which the substrate (or heat source) is moved and a period in which the substrate (or heat source) is stopped at a given location. The substrate or heat source can be moved in at least 1, 2, 3, 4, 5, 6, 7, 8, 9, 10, 100, 1000, or 10,000 steps.

In some examples, a heat source is a convective heat source, electromagnetic heat source, or both. In an example, the heat source is an electromagnetic heat source that is configured to provide infrared (IR) light. As an alternative, the heat source can be combined or replaced with a source of light with a wavelength that is suited to cure or anneal the mask, such as, for example, ultraviolet light.

Figure 4A:
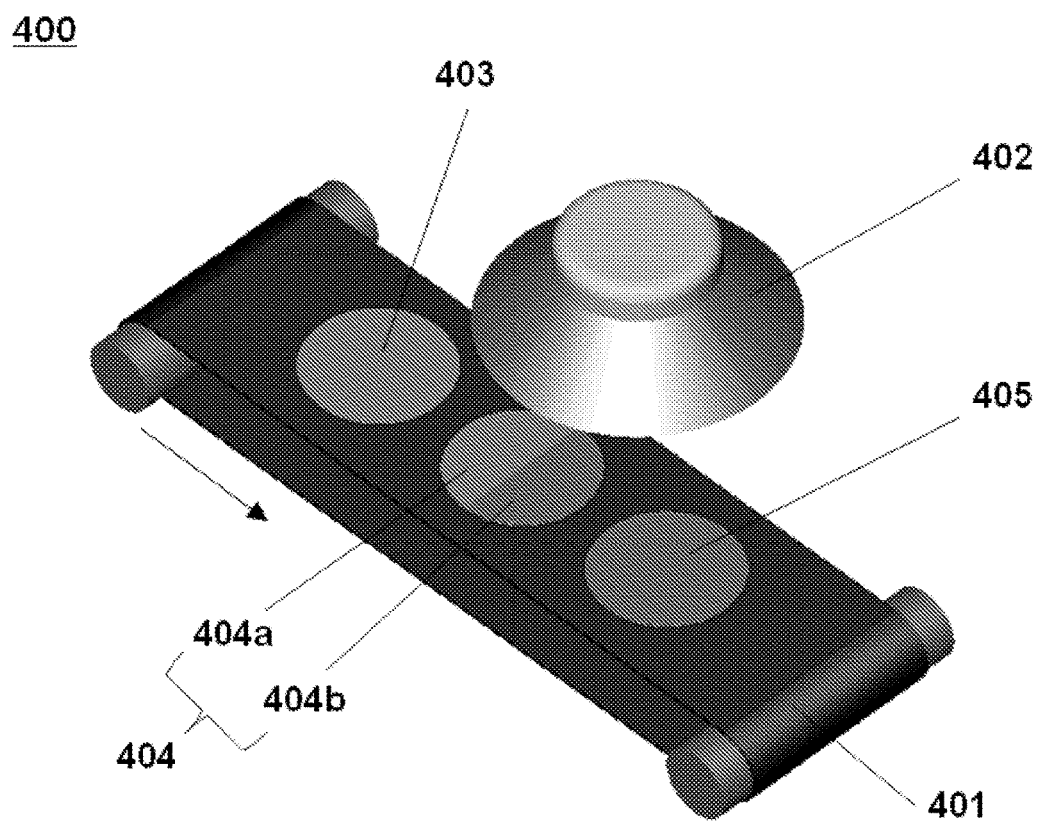
FIGS. 4A and 4B are schematic perspective and side views, respectively, of a system for forming a mask adjacent to a substrate.
Figure 4B:
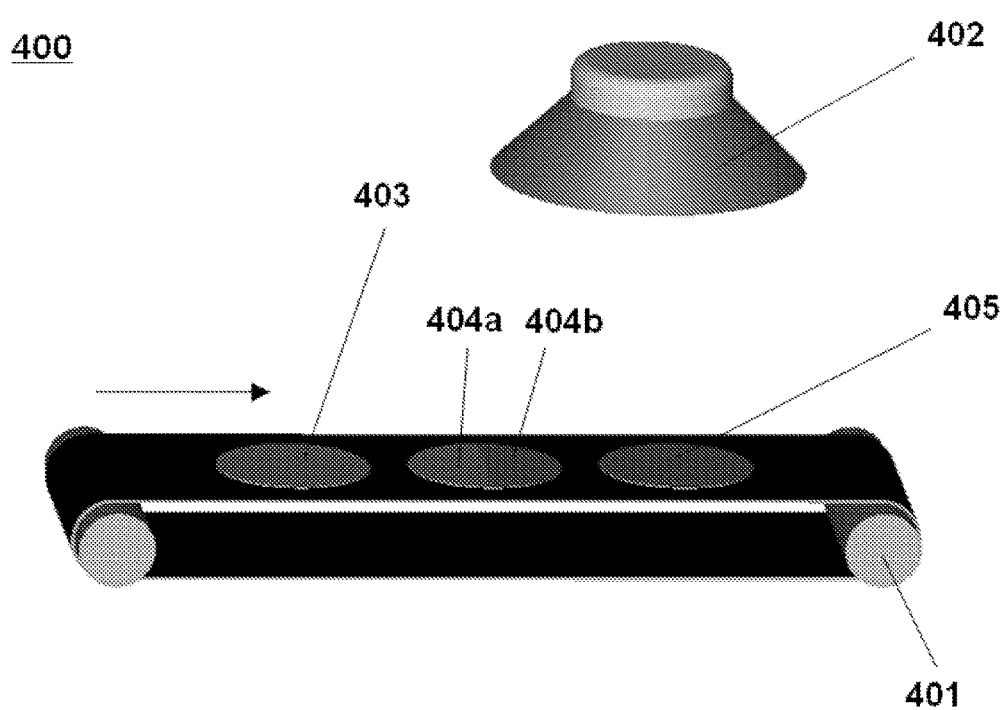

FIGS. 4A and 4B show a system 400 for forming a mask adjacent to a wafer, in accordance with various embodiments of the disclosure. The mask can be used to form an element for a thermoelectric device. The system 400 includes a conveyor assembly 401 and a heat source 402. In some cases, the heat source is a heat lamp (e.g., a lamp configured to emit IR light). Alternatively, the heat source 402 can be a laser. The heat source 402 can include a source of infrared energy and one or more optics for directing infrared energy to a polymeric material adjacent to a wafer. The polymeric material in some cases is spin-coated over a wafer.

In some embodiments, the conveyor assembly 401 includes a motor for moving a support platform adjacent to a wafer. The support platform can contain a heat source, such as a hot plate. The support platform in some cases is a conveyor belt.

In some embodiments, the conveyor assembly 401 is rotatable along an axis perpendicular to the direction of motion of a wafer on a platform of the conveyor assembly. This can permit the adjustment of an angular disposition of a wafer in relation to the heat source 402.

In the illustrated example of FIGS. 4A and 4B, the system 400 includes a first wafer 403, second wafer 404 and third wafer 405 that are disposed on a support platform of the conveyor assembly 401. The wafers 403, 404, and 405 are supported on the conveyor assembly 401, which transports the wafers along the direction indicated by the arrow. The system 400 can contain a heat source that can preheat the wafers before they are moved into the line-of-sight of the heat source 402. In the illustrated example, the first wafer has yet to be exposed to heat from the heat source 402, a portion of the second wafer 404 has been exposed to the heat source, and the third wafer 405 has been fully exposed to the heat source. The second wafer 404 includes an untransformed portion 404a that has not been exposed to heat from the heat source 402 and a transformed portion 404b that has been transformed to heat from the heat source 402.

An untransformed film can include a polymeric mixture that has not been exposed to heat from the heat source 402. The polymeric mixture is included in a film adjacent to a substrate, such as a semiconductor (e.g., silicon) substrate. The polymeric mixture can include a mixture of a first polymeric material and second polymeric material, as described herein. In an example, the first polymeric material is polystyrene and the second polymeric material is a block copolymer, such as poly(methyl methacrylate) (PMMA), poly(dimethylsiloxane) (PDMS), poly(ethylene oxide) (PEO), poly(4-vinylpyridine) (P4VP), poly(2-vinylpyridine) (P2VP), poly(styrene-b-dimethylsiloxane) (PS-b-PDMS), poly(styrene-b-ethylene oxide) (PS-b-PEO), poly(styrene-b-4-vinylpyridine) (PS-b-P4VP), poly(styrene-block-2-vinylpyridine) (PS-b-P2VP), or mixtures thereof.

The second wafer 404 includes an untransformed portion 404a and a transformed portion 404b. The transformed portion 404b has been exposed to heat from the heat source 402, which has facilitated a phase separation of the second polymeric material from the first polymeric material. The transformed portion 404b includes three-dimensional structures in a polymeric matrix adjacent to the second wafer. The third wafer 405 includes a transformed film and little to no untransformed film. The third wafer, having passed below the heat source 402, includes a transformed film with three-dimensional structures in a polymeric matrix.

During processing, an untransformed film adjacent to a wafer, as supported on the conveyor assembly 401, is directed (along the direction indicated by the arrow) to an area between the conveyor system 401 and the heat source 402. The area can be illuminated by the heat source 402 if the heat source is a radiative heat source. Upon exposure to heat from the heat source 402, the untransformed film is converted to a transformed film.

In an example, during processing the first wafer 403 is brought in view of the heat source 402 with the aid of the conveyor system 401. As the first wafer 403 passes in line of sight of heat source 402, an untransformed film adjacent to the wafer 403 is converted to a transformed film at a predetermined rate and along a direction generally antiparallel to a direction of motion of the first wafer in relation to the heat source 402. Exposure of the untransformed film on the first wafer 403 to heat from the heat source 402 anneals (or heats) the first wafer 403, which converts the untransformed film to a transformed film. Upon conversion from an untransformed film to a transformed film, the second polymeric material phase separates from the first polymeric material to form three-dimensional structures (e.g., cylindrical-type structures) in a polymeric matrix having the first polymeric material.

A transformed film can have one or more domains of three-dimensional structure. For instance, the transformed film of the third wafer 405 has one or more domains of three-dimensional structures, as defined by the second polymeric material that has phase separated from the first polymeric material. In some cases, the transformed film region of the third wafer 405 has a single domain of the polymeric material, and the distribution of three-dimensional structures is uniform. The three-dimensional structure can be distributed in a square, rectangular, pentagonal, or hexagonal arrangement.

In some embodiments, an untransformed film is converted to a transformed film at a rate that is a function of one or more of the heating rate and the rate at which a wafer (e.g., the first wafer 403) is brought in view of the heat source 402. The heating rate can be a function of the heating power (e.g., power supplied to an infrared bulb).

In some cases, a uniform distribution of three-dimensional structures is formed in a polymeric matrix by moving an unprocessed wafer below the heat source 402 at a rate of at least about 0.1 millimeters (mm) per minute, or 1 mm per minute, or 10 mm per minute, or 100 mm per minute, or more. In some cases, a uniform distribution of three-dimensional structures is formed in a polymeric matrix by heating an unprocessed wafer at a rate of at least about 1 K per minute, or 10 K per minute, or 100 K per minute, or more.

In some embodiments, the system 400 aids in the formation of a mask having three-dimensional structures uniformly distributed in a polymeric matrix. In some situations, the mask has little to no domain boundaries and may have the configuration suitable to form elements with structures (e.g., holes) uniformly distributed, as described above in the context of FIGS. 3A and 3B.

Figure 5A:
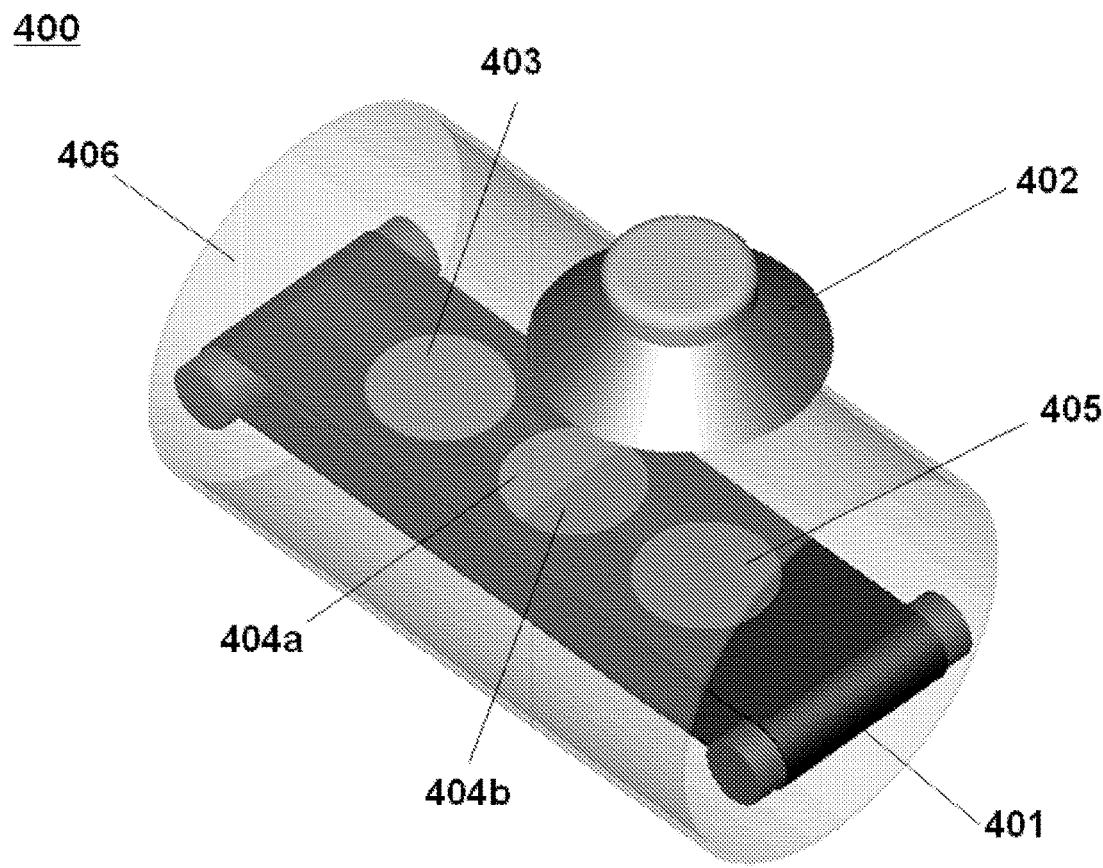
FIGS. 5A and 5B are schematic perspective and side views, respectively, of the system of FIGS. 4A and 4B having an enclosure.
Figure 5B:
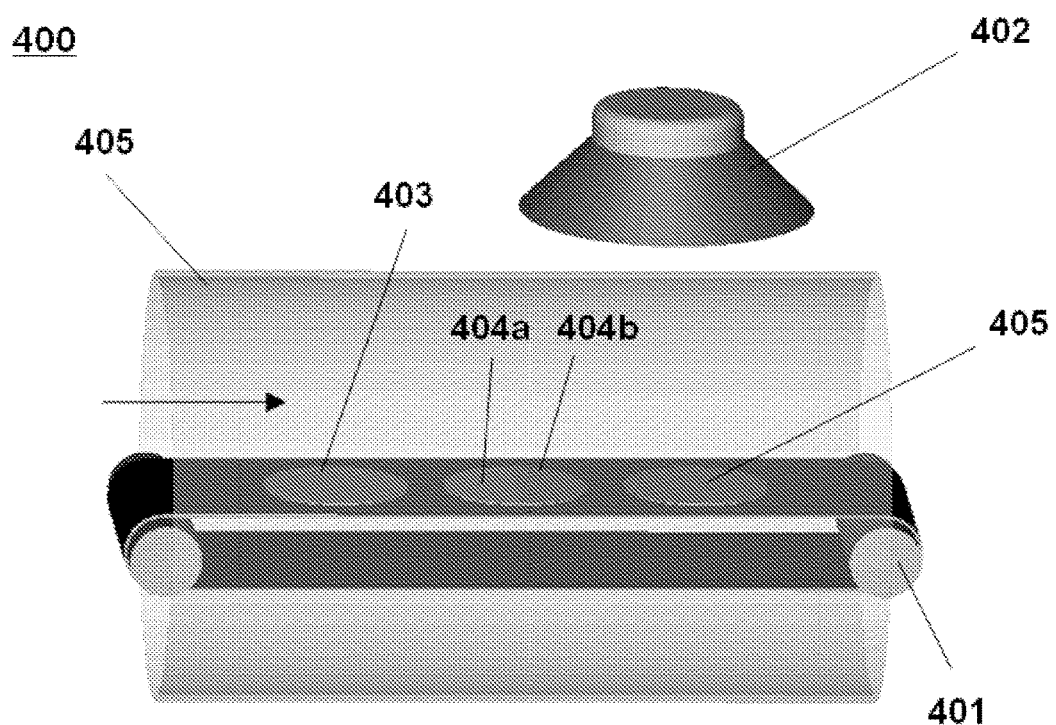

In some embodiments, the conveyor assembly 401 can be included in a controlled environment, such as an enclosure for providing vacuum or a supply of an inert gas (e.g., Ar, Ne, $N_2$, He). The enclosure in some cases is a vacuum chamber, which can be used for vapor delivery and/or evacuation. FIGS. 5A and 5B schematically illustrate an enclosure 405 having the conveyor system 401. The enclosure 405 can be a glass or stainless steel enclosure, for example. The enclosure 405 can enable vapor or vacuum annealing. In some situations, the enclosure 405 is in fluid communication with a pumping system having one or more vacuum pumps for providing a predetermined pressure within the enclosure.

Figure 6A:
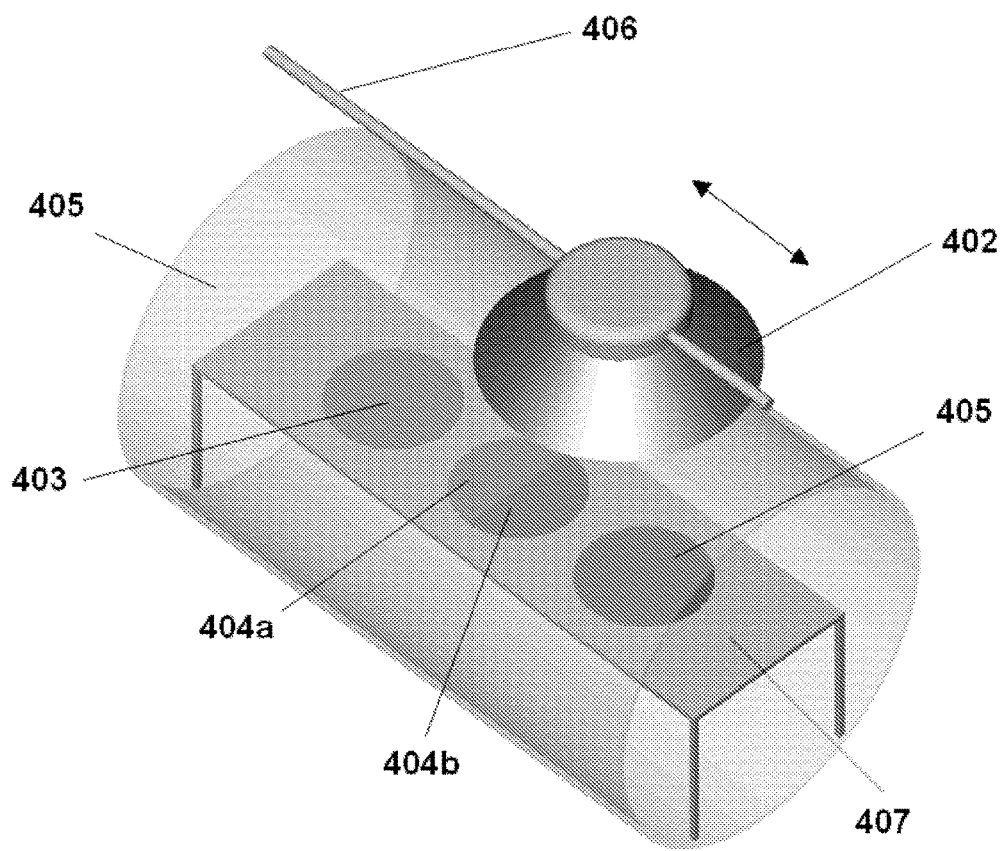
FIGS. 6A and 6B are schematic perspective and side views, respectively, of the system of FIGS. 4A and 4B having a rail for translating a heat source.
Figure 6B:
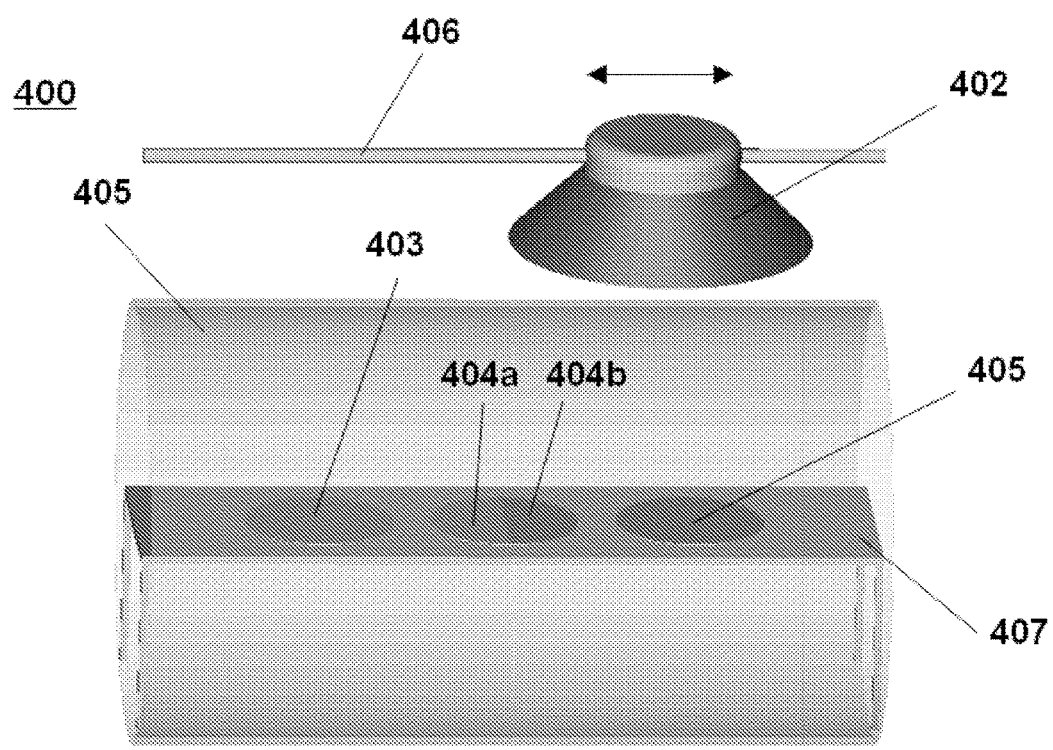

In some embodiments, the heat source 402 can be supported on a rail (or track) 406 to enable the position of the heat source 402 to be adjusted, as schematically illustrated in FIGS. 6A and 6B. The rail 406 in some cases can include a motor or other mechanism (e.g., piezzo) to aid in adjusting the location of the heat source along the direction indicated by the two-way arrow. In some cases, the rail 406 can enable an angle of the heat source in relation to the conveyor system 401, the unprocessed wafer 403 and/or the processed wafer 404 to be adjusted.

In some situations, the conveyor assembly 401 can be precluded and wafers can be supported on an immovable support platform, such as, for example, a platform configured to hold or support one or more wafers but remain stationary in relation to the heat source 402. The platform in some cases is a susceptor, which can be a heated susceptor. In the illustrated example of FIGS. 6A and 6B, wafers are supported on an immovable support platform 407. Heat to the wafers 403, 404 and 405 is supplied by the heat source 402 that can be moved and brought in line-of-sight of the wafers 403, 404 and 405 with the aid of the rail 406.

Figure 7:
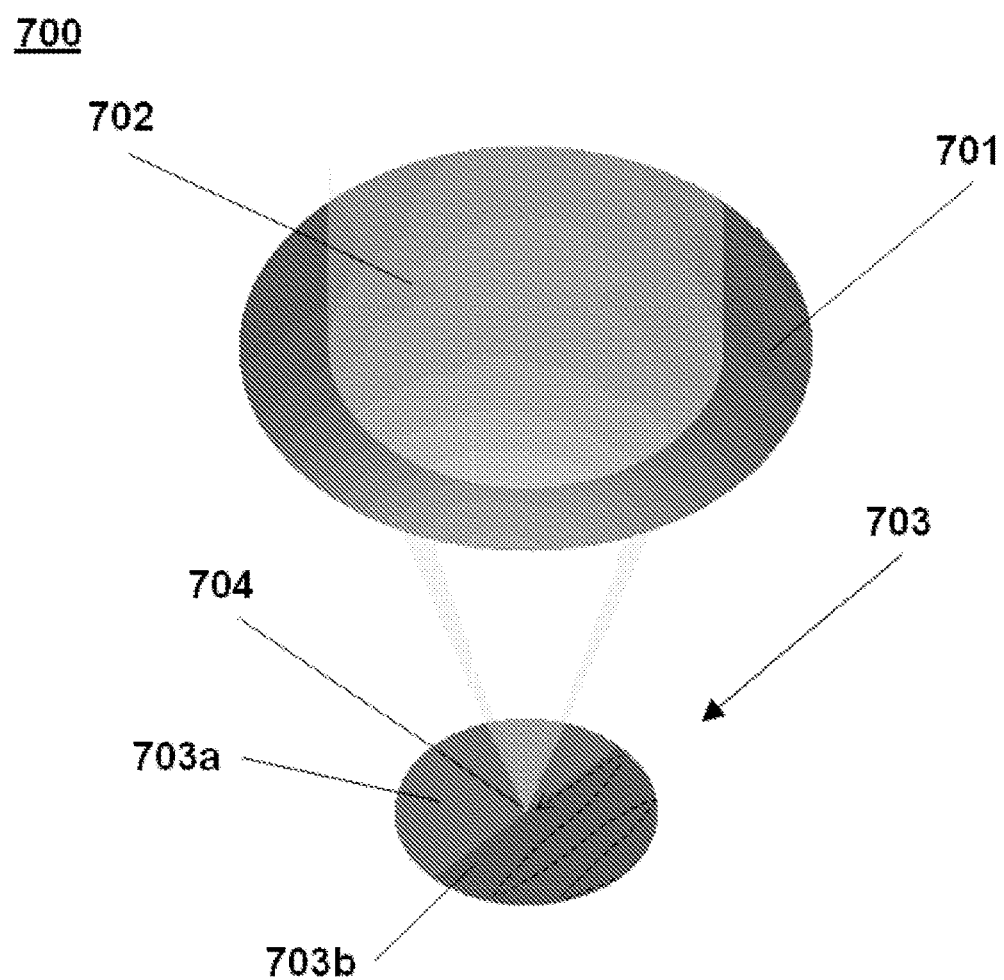
FIG. 7 schematically illustrates an optical system for providing radiant energy to a surface of a substrate (or wafer)

A heat source can be optically coupled to an optical system for directing radiant energy to a polymeric material adjacent to a wafer. FIG. 7 shows an optical system 700 having a focusing lens 701 for directing light 702 to an exposed surface of a wafer 703 having a film comprising a transformed and/or untransformed polymeric matrix. In an example, light 702 is spatially and temporally coherent light (e.g., laser light) or infrared radiation. The focusing lens generates a spot 704 on the film, which can be used to define a rastering pattern by moving the wafer 703, the focusing lens 701 and/or a source of light 702. In some situations, the rastering pattern can be serpentine, spiral, circular, box-like (e.g., square, rectangular), or sinusoidal. The surface of the wafer 703 includes an untransformed region 703a and a transformed region 703b.

The system 400 of FIGS. 4-6 and the optical system 700 of FIG. 7 can be used to form a mask adjacent to a substrate (or wafer), which can be subsequently used to form an element having a plurality of holes in the substrate, such as a semiconductor substrate (e.g., silicon), or a plurality of wires formed from the substrate. The element can be formed by using the mask to define a pattern of metallic material adjacent to a surface of the substrate, and using the metallic material to catalytically etch the substrate to define a pattern of holes or wires.

The system 400 and 700 can be used to form a mask having an array of uniformly distributed holes in a polymeric matrix, which can be subsequently used to catalytically form an array of holes or wires in the substrate, the array having uniformly distributed holes or wires.

In an example, the system 400 is used to form a mask (or template) having three-dimensional structures provided over a substrate. The substrate can be a semiconductor substrate, such as a silicon substrate (e.g., n-type or p-type silicon). The three-dimensional structures can be cylinders (or rods). Alternatively, the three-dimensional structures can have other shapes; in some examples, the three-dimensional structures can be triangular, square, or rectangular. The three-dimensional structures can have various sizes and distributions. In some situations, the three-dimensional structures have widths (or diameters) between about 1 nanometer ("nm") and 500 nm, or 5 nm and 100 nm, or 10 nm and 30 nm. The three-dimensional structures can have a center-to-center spacing between about 1 nm and 500 nm, or 5 nm and 100 nm, or 10 nm and 30 nm. In some embodiments, the three-dimensional structures are distributed in an array of three-dimensional structures that is monodisperse. Monodisperse structures may have substantially the same size, shape and/or distribution (e.g., cross-sectional distribution).

In some situations, the three-dimensional structures are in a close packing arrangement, such as a hexagonally close packing arrangement. In other situations, the three-dimensional structures are in a random arrangement. In some cases, the three-dimensional structures are arranged in groups. Each group can have a predetermined distribution of the three-dimensional structures. The three dimensional structures can be asymmetric, having lengths longer than their widths (or diameters).

The mask can be formed of a first polymeric material, such as polystyrene, and the three-dimensional structures can be formed of a second polymeric material, such as PMMA. The mask is formed by providing a polymeric mixture comprising the first and second polymeric materials, and coating the mixture onto the substrate using, for example, a spin coater or other systems and devices that may be used in semiconductor fabrication, such as, for example, dip coater, ink jet printing, spray coating, drop casting, layer by layer coating using the Langmuir-Blodgett trough. In some cases, a spin coater is used to coat the mixture onto the substrate. A spin coater can be operated at between about 100 revolutions per minute (RPM) and 10,000 RPM, or 1000 and 4000 RPM, or 2000 and 3000 RPM, for a time period of at least about 1 second, 2 seconds, 3 seconds, 4 seconds, 5 seconds, 10 seconds, 15 seconds, 20 seconds, 25 seconds, 30 seconds, 35 seconds, 40 seconds, 45 seconds, 50 seconds, 55 seconds, 1 minute, 5 minutes, 10 minutes, 30 minutes, 1 hour, 12 hours, 24 hours, or more.

After coating the polymeric mixture over the substrate, the substrate can be heated, such as with the aid of the system 400 and the optical system 700. In an example, the substrate is directed along the conveyor assembly of 401 of FIGS. 4 and 5 and heated with the aid of the heat source 402 to convert, at a predetermined rate, an untransformed film having the polymeric mixture to a transformed film having three-dimensional structure defining a pattern. In some embodiments, upon heating, the second polymeric material phase separates in a matrix of the first polymeric material to form the three-dimensional structures. The mask can be formed of a block copolymer having the first polymeric material and second polymeric material.

In some embodiments, after the mixture is applied (e.g., spin-coated) to the substrate, the system 400 can be used to heat (or anneal) the substrate at a temperature between about 100° C. and 300° C., or 150° C. and 250° C., or 180° C. and 210° C. for a period of at least about 1 second, or 10 seconds, or 30 seconds, or 1 minute, or 10 minutes, or 20 minutes, or 30 minutes, or 1 hour, or 2 hours, or 3 hours, or 4 hours, or 5 hours, or 6 hours, or 12 hours, or 24 hours, or 48 hours. In some situations, the substrate can then be irradiated with ultraviolet light (e.g., 254 nm UV light) for a period of at least about 1 min, or 2 min, or 3 min, or 4 min, or 5 min, or 10 min, or 15 min, or 20 min, or 25 min, or 30 min.

Following formation of a transformed film adjacent to the substrate, the second polymeric material (including the three-dimensional structures) is etched relative to the first polymeric material. The second polymeric material can be etched with the aid of an acid, such as, e.g., nitric acid, acetic acid, hydrogen fluoride (HF), hydrogen chloride (HCl), hydrogen bromide (HBr), or hydrogen iodide (HI), or other etching chemistries, such as ozone or sodium hydroxide (NaOH). In an example, if the second polymeric material is formed of PMMA, the second polymeric material can be etched using acetic acid. Alternatively, gas phase etching can be performed, such as, for example, reactive ion etching using $O_2$, $CF_4$, $CHF_3$ or combinations thereof. Etching the polymeric material generates holes in the mask. The holes can expose a surface of the substrate adjacent to the mask. The exposed surface can include a layer of an oxide (native or thermally grown), such as a silicon oxide (e.g., silicon dioxide) if the substrate is formed of silicon. The oxide layer is removed by exposing the mask and the exposed portions of the substrate to an oxide etchant. In an example, the mask and exposed portions of the substrate are exposed to $CF_4/O_2$ and/or a buffered oxide etch (or a buffered hydrofluoric etch, "BHF").

BHF can be a mixture of a buffering agent, such as ammonium fluoride ($NH_4F$), and hydrofluoric acid (HF). In some cases, HCl is added to a BHF solution in order to dissolve insoluble products. In an example, a buffered oxide etch solution comprises a 6:1 volume ratio of about 40% $NH_4F$ in water to 49% HF in water. This solution can etch thermally grown oxide at a rate of at least about 0.1, 0.5, 1, 2, 3, 4, 5, 10 nanometers per second at 25° C. Exposing the mask and the exposed portions of the substrate to an oxide etchant can remove the oxide layer from the exposed portions of the substrate.

In some embodiments, during the substrate can be rinsed with an acid (e.g., acetic acid, HF, HI) for a period of at least about 1 min, or 2 min, or 3 min, or 4 min, or 5 min, or 10 min, or 15 min, or 20 min, or 25 min, or 30 min, and water for a period of at least about 1 second, or 10 seconds, or 30 seconds, or 1 min, or 2 min, or 3 min, or 4 min, or 5 min to remove the second polymeric material (e.g., PMMA) and cross-linking a matrix having the first polymeric material.

Next, an etching layer is deposited on the mask and exposed portions of the substrate. The etching layer can include a metallic material. In some embodiments, the metallic material includes one or more elemental metals. For instance, the metallic material can include one or more metals selected from gold, silver, platinum, chromium, molybdenum, tungsten, palladium, other metals (e.g., noble metals), or combinations thereof. The etching layer can be deposited with the aid of various deposition techniques, such as physical vapor deposition (e.g., sputtering, evaporative deposition), chemical vapor deposition (CVD), atomic layer deposition (ALD), or electroplating. In some embodiments, the etching layer, as formed, has a thickness between about 1 nm to about 500 nm, or 5 nm and 100 nm, or 10 nm and 30 nm. The etching layer can be formed on the mask and the exposed portions of the substrate.

Next, the mask is removed to leave an array (or pattern) of metallic material from the etching layer on the substrate. In some embodiments, the array of metallic material is monodisperse. Next, the metallic material of the etching layer and exposed portions of the substrate are exposed to an oxidizing agent (e.g., $O_3$, $NO_2$, $H_2O_2$) and a chemical etchant (e.g., HF), either simultaneously or sequentially (i.e., oxidizing agent after chemical etchant, or chemical etchant after oxidizing agent). In some embodiments, the metallic material facilitates a catalytic oxidation of the substrate at the metal-substrate interface, thereby forming an oxide between the metallic material and the substrate. The chemical etchant (also "etchant" herein) then removes the oxide. Subsequent oxidation of the substrate and removal of an oxide formed between the metallic material and the substrate generates holes in the substrate. In some embodiments, the holes have lengths that are longer than the widths (or diameters) of the holes (i.e., the holes are anisotropic). The metallic material can then be removed with the aid of a chemical etchant to leave holes in the substrate.

Alternatively, an etch block layer comprising a first metallic material can be deposited on the mask and exposed portions of the substrate. In some cases, the first metallic material includes one or more metals selected from chromium, molybdenum, tungsten, titanium and niobium. The mask can be removed to expose the substrate, as described above. Next, an etching layer comprising a second metallic material can be deposited on the etch block layer and exposed portions of the substrate. The second metallic material can be selected from gold, silver, platinum, chromium, molybdenum, tungsten, palladium, other metals (e.g., noble metals), or combinations thereof. The etching layer can then be exposed to an oxidizing agent (e.g., $O_3$, $NO_2$, $H_2O_2$) and a chemical etchant (e.g., HF) to form rods (or wires) in the substrate, either simultaneously or sequentially (i.e., oxidizing agent after chemical etchant, or chemical etchant after oxidizing agent). The first and second metallic materials on the rods can then be removed to leave rods (e.g., free-standing cylinders) formed from the substrate. In some situations, the bases of the rods are attached to the substrate.

The disclosure provides various methods for forming inclusions (e.g., holes, wires) in or from a substrate, which can subsequently be used as a thermoelectric element (e.g., element 101 of FIG. 1) of a thermoelectric device.

Metallurgical Methods

Another aspect provides methods for forming inclusions by a metallurgical technique that can rely on the eutectic (or near-eutectic) solidification of a binary (or in some cases ternary or quaternary) phase alloy, which results in the formation of rods or lamellar plate morphology in a solid. The inclusions can be nanoinclusions, and the rods or lamellar plates can have dimensions on the order of nanometers to microns. This technique advantageously permits the formation of a bulk thermoelectric material by self assembly.

The binary phase alloy can comprise a first phase and a second phase, which can be solid state phases. The second phase can comprise a sacrificial material, which can be removed by etching to provide a solid matrix having the first phase. The first phase can contain inclusions (e.g., nanoinclusions) at locations in which the sacrificial phase (second phase) was removed. The size and shape of the inclusions can be controlled to various dimensions, such as nanoscopic dimensions, by controlling the cooling rate as well as the spacing between the inclusions. This approach can be used to form inclusions having rods or holes with dimensions and properties described elsewhere herein. Nanoscopic dimensions, both for the size of the nanoinclusions and spacing, may be preferable in some cases so that phonon scattering is enhanced and thermal conductivity is reduced.

In an example, a mixture comprising a first solid state material and a second solid state material is heated to a temperature that is at or above a eutectic temperature of an alloy comprising the first and second solid state materials, and the mixture is subsequently cooled to a temperature below the eutectic temperature to provide the alloy phase separated in a solid state matrix comprising one of the first solid state material or the second solid state material. The alloy can be removed (e.g., selectively etched) to provide the solid state matrix with inclusions (e.g., holes) therein. In some cases, the first solid state material comprises a semiconductor, such as silicon, silicon-germanium alloy, germanium, silicon carbide. The second solid state material can comprise titanium, magnesium, aluminum, nickel, palladium, platinum.

In some embodiments, the rod or lamellar plates form at or near the eutectic composition of the binary phase alloy. This can be accomplished by weighing the starting two elemental solids at the eutectic composition and then adding them to a crucible that is heated above the eutectic temperature of the alloy to form a liquid melt. The melt is then rapidly cooled via a quench. The quench can be performed in oil or with the aid of a splat method, which can involve placing the molten liquid on a cold plate. In such a case, the molten liquid can solidify rapidly. The morphology of the solidified material can include a nanoscale rod-like phase embedded in the other host phase material or adjoining lamellar plates of both phases. The rod-like phase can be removed by etching, such as chemical (e.g., HF etching) and/or mechanical etching (e.g. chemical mechanical polishing). Similarly, one of the lamellar phases can be removed by etching. The result is a bulk thermoelectric material with nanoinclusions that scatter phonons and reduce thermal conductivity.

An example material is the silicon-titanium binary phase material. At or near the eutectic point the two solid phases are Si and titanium silicide (e.g., $TiSi_2$). The silicon phase can be doped n-type or p-type based on the desired doping configuration of the thermoelectric element. The titanium silicide can self-assemble into rods in the silicon matrix. The diameters of the rods can be controlled by adjusting or otherwise selecting the cooling rate during solidification.

In an example, the silicon-titanium binary phase alloy is formed by loading a crucible with silicon and titanium (e.g., silicon and titanium solids). The proportions of silicon and titanium can be selected to form a binary phase alloy having silicon and $TiSi_2$. In an example, the ratio of silicon to titanium is about 3:1 by weight. The crucible is then heated to a temperature of about 1330° C. or higher, and subsequently rapidly cooled to room temperature. The cooling rate can be at least about 1 K/s, 10 K/s, or 100 K/s. This forms a binary phase alloy comprising $TiSi_2$ in a Si host matrix. The $TiSi_2$ can be disposed in the Si in the form of rods. The rod density and uniformity can be controlled via directional solidification or Czochralski like growth. The $TiSi_2$ is then removed from the Si host matrix via an etching process, such as a chemical etching process that selectively removes $TiSi_2$ but not the silicon host matrix material. In an example, hydrofluoric acid, or sulfuric acid with an oxidizer (e.g., $H_2O_2$), can be used to selectively remove $TiSi_2$. The resultant material is a bulk silicon ingot with nanoinclusions (here, holes) that scatter phonons and reduce thermal conductivity. The reduced thermal conductivity can increase thermoelectric device efficiency.

Figure 8:
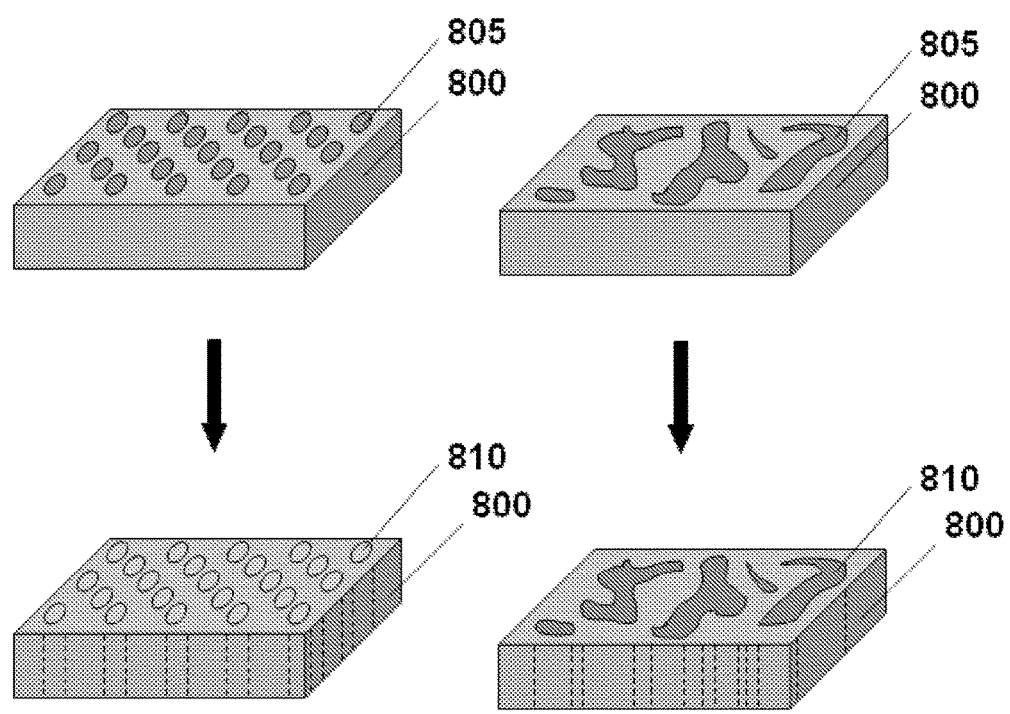
FIG. 8 schematically illustrates a metallurgical method for forming a thermoelectric element for a thermoelectric device.

FIG. 8 shows a method for forming inclusions by providing a binary phase comprising a first phase 800 (e.g., silicon) having a second phase 805 (e.g., $TiSi_2$) formed therein. The first phase 800 and second phase 805 can be formed by providing a first and second material, and heating the materials to a eutectic point of the binary phase alloy. The second phase 805 extends from an exposed top surface of the first phase 800 into the bulk of the first phase 800. The binary phase can define rods (FIG. 8, left) or plates (FIG. 8, right) extending into the first phase 800, which rods or plates are phase separated from the first phase 800. Next, the second phase 805 is selectively etched in relation to the first phase 800, which etching removes the material comprising the second phase 805 to generate holes 810 bounded by the first phase 800. The holes 810 extend through the first phase 800. By selectively etching the second phase 805 in relation to the first phase 800, the material comprising the second phase 805 can be removed at a rate that is greater than the rate at which the material comprising the first phase 800 is removed. This method can be used to form holes in a matrix or cross-linked wires. In the case of cross-linked wires, portions of the first phase 800 can be interconnected.

Thermoelectric modules can require both p and n-type elements for operation. The metallurgical techniques of the disclosure can allow for ease of doping, since the dopant atoms are introduced in the starting material before the melting, or, alternatively, can be introduced during the melting and/or subsequent growth.

Nanoimprint Lithography Methods

Another aspect provides methods for forming inclusions using lithography. Nanoimprint lithography, stamping, or hot embossing techniques can generate nanoscopic patterns in a resist or other mask material by the mechanical deformation of the resist by a mold. The resist can be a polymer resist, such as a curable polymer resist. The mold can include one or more predefined patterns of features, such as circular or square pillars that have diameters and sizes on the nanometer scale. The mold can be formed by photolithography, such as electron beam lithography. Nanoimprint lithography can advantageously be performed on any thermoelectric material system and can have high throughput.

Figure 9:
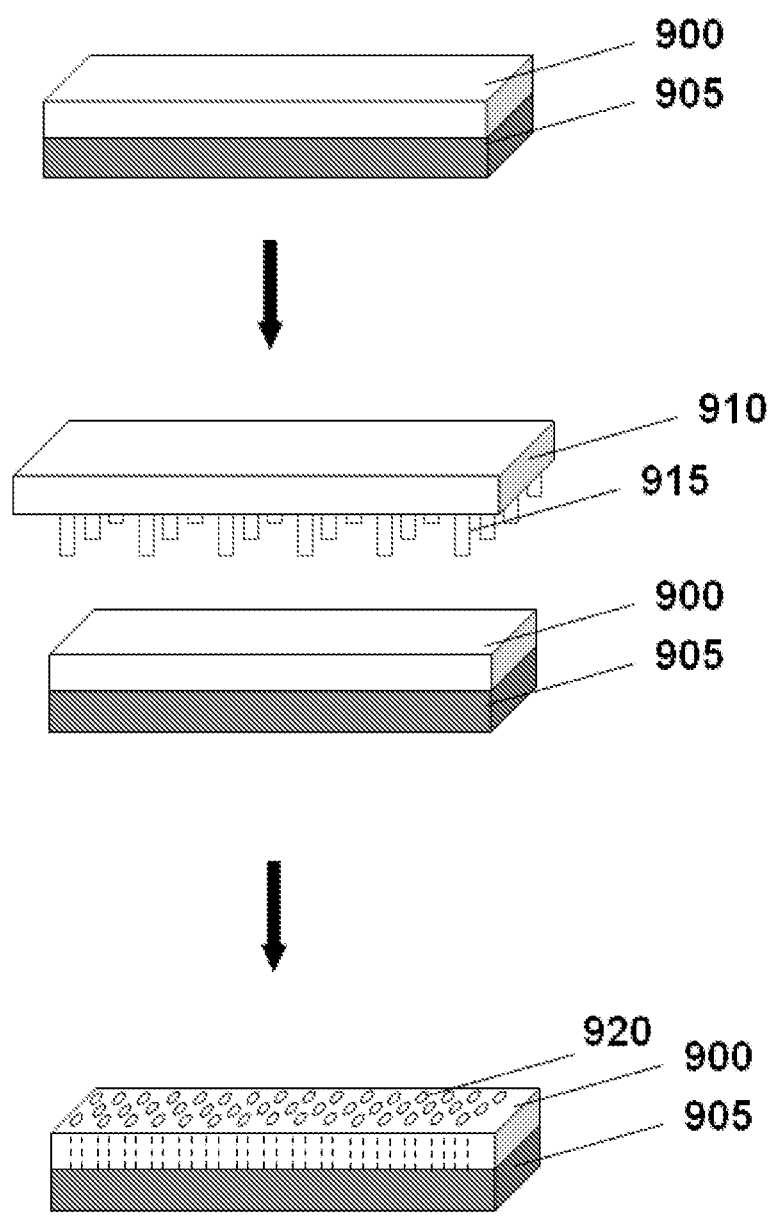
FIG. 9 schematically illustrates a lithographic method for forming a thermoelectric element for a thermoelectric device.
Figure 9:
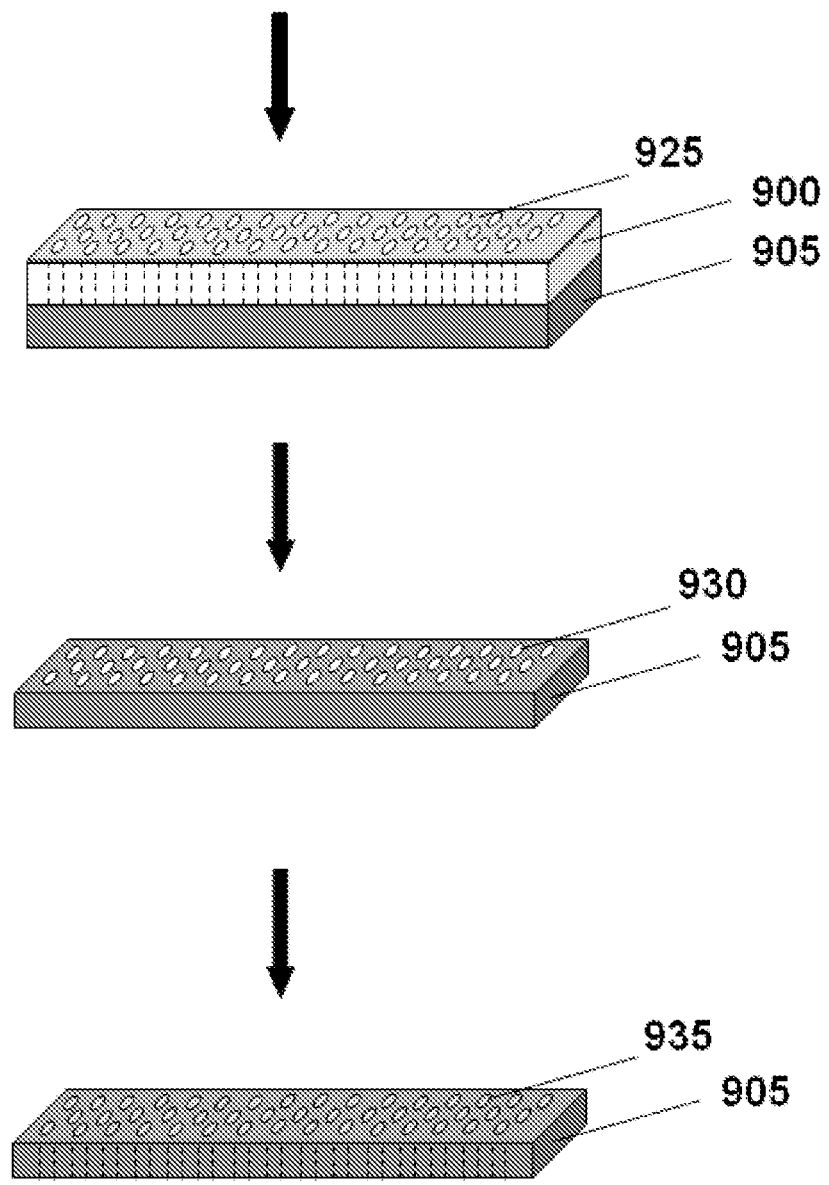

FIG. 9 schematically illustrates a method for forming inclusions (e.g., holes) in a substrate. The method illustrated in FIG. 9 transfers a pattern of holes or wires from a template to a mask, which pattern is subsequently used to form a pattern of inclusions (e.g., nanoinclusions) in the substrate. In a first step, a mask 900 is formed by spin coating a polymeric material onto a bulk or thin film substrate 905, such as an n-type or p-type semiconductor material (e.g., silicon). Next, a template 910 comprising a pattern of pillars 915 is brought adjacent to the mask 900. The pillars 915 on the mold are then pressed into the polymer 900 and the polymer is expelled or otherwise removed from below (or to the side of) the pillars. This can form a polymer film with nanoscopic circular or square voids 920. Next, a layer 925 of a metallic material is deposited on the mask 900. The metallic material can include gold, silver, platinum, chromium, molybdenum, tungsten, palladium, and other metals (e.g., noble metals). The mask 900 is then removed, which removes the polymer of the mask 900 along with the metal on top of the polymer. Metals that fill the voids 920 remain as particles 930 on the surface, which are used as catalysts to catalytically etch the substrate 905 and transfer the pattern into the substrate 905. In some examples, the pattern is formed in the substrate 905 with the aid of a wet etch. Such an approach can be used to form a pattern of holes in the substrate 905. Forming the patter of particles in the substrate 905 creates nanoinclusions 935 in the substrate 905, thereby reducing thermal conductivity and increasing device efficiency.

As an alternative, the particles 930 can be formed of a first metallic material and a second metallic material (not shown) can be deposited on the substrate 905. Next, an etching chemistry catalytically etches the substrate 905 with the aid of the second metallic material, and the first metallic material masks (or shields) the substrate 905 from etching portions of the substrate 905 below the first metallic material. Such an approach can be used to form a pattern of pillars (or wires) from the substrate 905.

As an alternative, the pillars 915 can be precluded and the template 910 comprises a pattern of holes. Pressing the template 910 against the mask 900 forms pillars (or rods) in the mask 900. The pillars are part of a pattern of pillars in the mask 900. Portions of the substrate 905 are exposed through the mask 900. An etching layer can then be deposited on the exposed portions of the substrate, which can be used to catalytically transfer the pattern of pillars to the substrate 905 to form pillars (or rods) from the substrate 905.

A pattern of features over the substrate 905 can be transferred to the substrate 905 with the aid of various methods of the disclosure, such as the catalytic methods described above and elsewhere herein. The resulting substrate 905 with the pattern of features (e.g., holes or rods) can subsequently be used as a thermoelectric element of a thermoelectric device.

Nanoparticle Templating Methods

Another aspect provides methods for forming inclusions in a substrate by generating a pattern of features on the substrate and subsequently transferring the pattern to the substrate. The pattern of features can be a close packed pattern of features. In some embodiments, nanoparticle templating using solvents, dip coating, or Langmuir-Blodgett is used to generate a close packed pattern of nanoparticles on a surface of a substrate, which pattern is then used either as metal catalysts for a wet etch into the substrate (see below), or as a template for metal liftoff. Metal nanoparticles can be self-assembled using solvent evaporation over large areas, such as areas in excess of 0.001 mm, 0.01 mm, 0.1 mm, 1 mm, 2 mm, 3 mm, 4 mm, 5 mm, or 10 mm in diameter. Dip coating can allow for the self-assembly of nanoparticles, as do Langmuir-Blodgett techniques.

Figure 10:
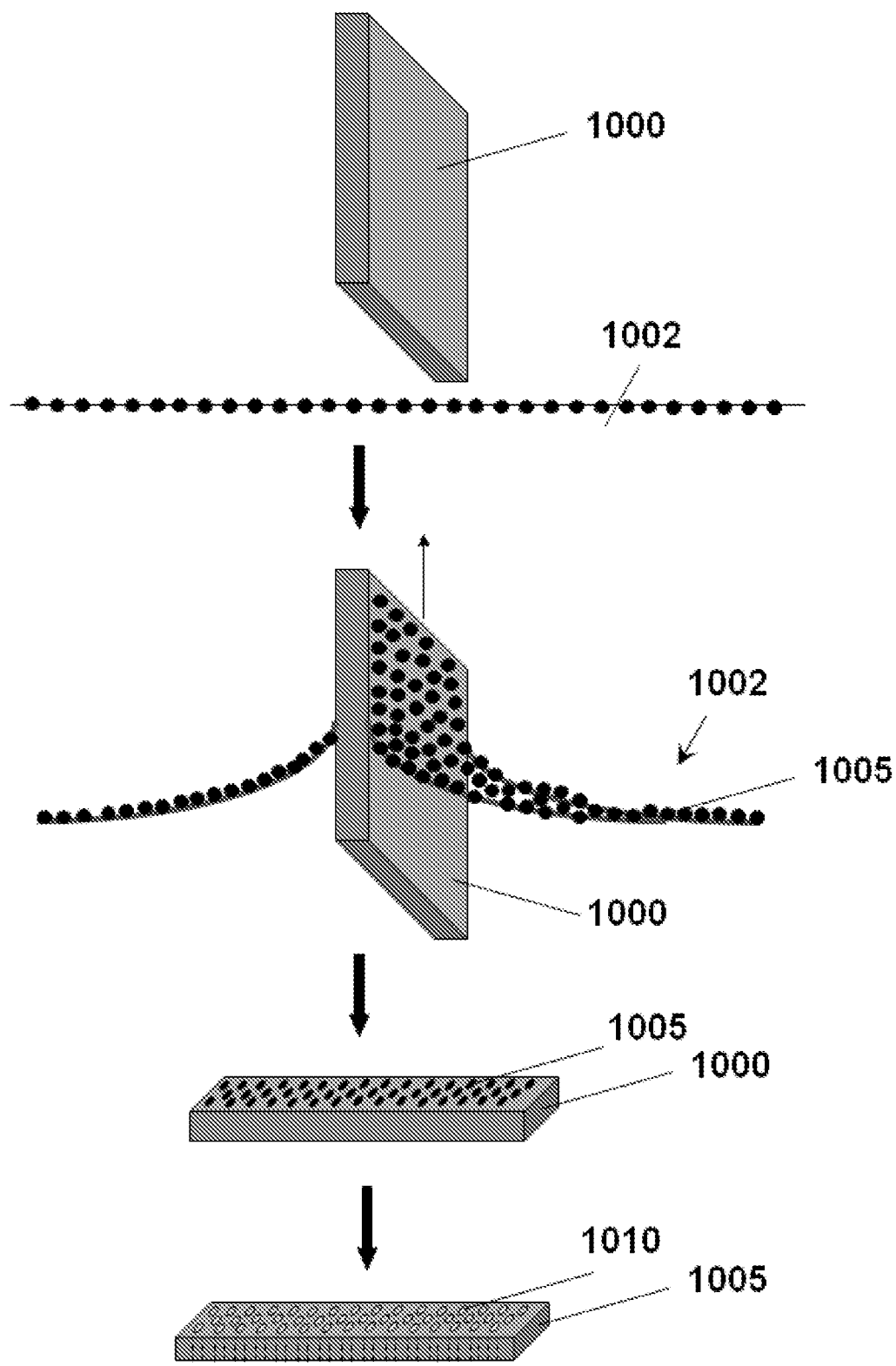
FIG. 10 schematically illustrates a method for forming inclusions in a substrate.

FIG. 10 schematically illustrates a method for forming inclusions in a substrate 1000. The substrate 1000 is dipped into a solution 1002 having metallic particles 1005 as emulsions. The metallic particles 1005 can be suspended on or towards a surface of the solution 1002. The substrate 1000 is withdrawn from the solution 1002 (up arrow) to provide the metallic particles 1005 from the emulsion on or adjacent to one or more surfaces of the substrate 1000, such as opposing surfaces of the substrate 1000, as illustrated. The metallic particles 1005 may be adsorbed to the one or more surface of the substrate 1000. In some cases, certain surface of the substrate 1000 can be coated to prevent metallic particles 1005 from adsorbing on the surfaces.

In some examples, the substrate 1000 is kept in the solution 1002 for a time period of at least about 0.1 seconds, 1 second, 2 seconds, 3 seconds, 4 seconds, 5 seconds, 10 seconds, 20 seconds, 30 seconds, 1 minute, 10 minutes, 30 minutes, 1 hour, 2 hours, 3 hours, 4 hours, 5 hours, 6 hours, 12 hours, or 1 day prior to being withdrawn from solution. In some cases, the substrate 1000 is directed into the solution 1002 at a rate of at least about 0.001 m/s, 0.01 m/s, 0.1 m/s, 1 m/s, 5 m/s, 10 m/s, or 100 m/s. The substrate 1000 can be withdrawn from the solution 1002 at a rate of at least about 0.001 m/s, 0.01 m/s, 0.1 m/s, 1 m/s, 5 m/s, 10 m/s, or 100 m/s.

The metallic particles 1005 define a pattern of particles, which can be catalytically transferred to the substrate 1000 to form holes 1010, as described elsewhere herein. For instance, the metallic particles 1005 can be exposed to an oxidizing agent (e.g., $O_3$, $NO_2$, $H_2O_2$) and a chemical etchant (e.g., HF). Alternatively, the metallic particles can serve as an etch block layer, and an etching layer can be used to form rods (or wires) from the substrate 1000 with the aid of another, as described elsewhere herein.

The solution 1002 can be formed by providing metallic particles 1005 into a liquid or solvent, such as, for example, water. In some cases, the solution 1002 can be mixed to help prevent agglomeration of the metallic particles 1005 into larger particles, or to help maintain a given particle size distribution of the metallic particles 1005 in the solution 1002. In some examples, the metallic particles 1005 have a particle size distribution of at least about 1 nanometer (nm), 5 nm, 10 nm, 50 nm, or 100 nm in the solution 1002. To form the solution 1002 comprising the metallic particles 1005, a powder or other solid form comprising the material of the metallic particles 1005 can be provided into the liquid or solvent, and the liquid or solvent can be subsequently mixed to provide the solution 1002 comprising the metallic particles 1005.

The substrate 1000 can be mechanically coupled to a support member to assist in directing the substrate 1000 into or out of the solution 1002. The support member can be attached to an actuator (e.g., motor) to effect the motion of the substrate 1000 into or out of the solution 1002.

Photolithographic Methods

Another aspect provides methods for forming inclusions (e.g., holes or wires) in a substrate by using photolithography to define a pattern of features in a mask, and subsequently transferring the pattern to the substrate to form the inclusions. The pattern can be transferred to the substrate by providing a catalytic material that facilitates the etching of the substrate to transfer the pattern of features in the mask to the substrate, thereby forming holes or inclusions in the substrate.

Figure 11:
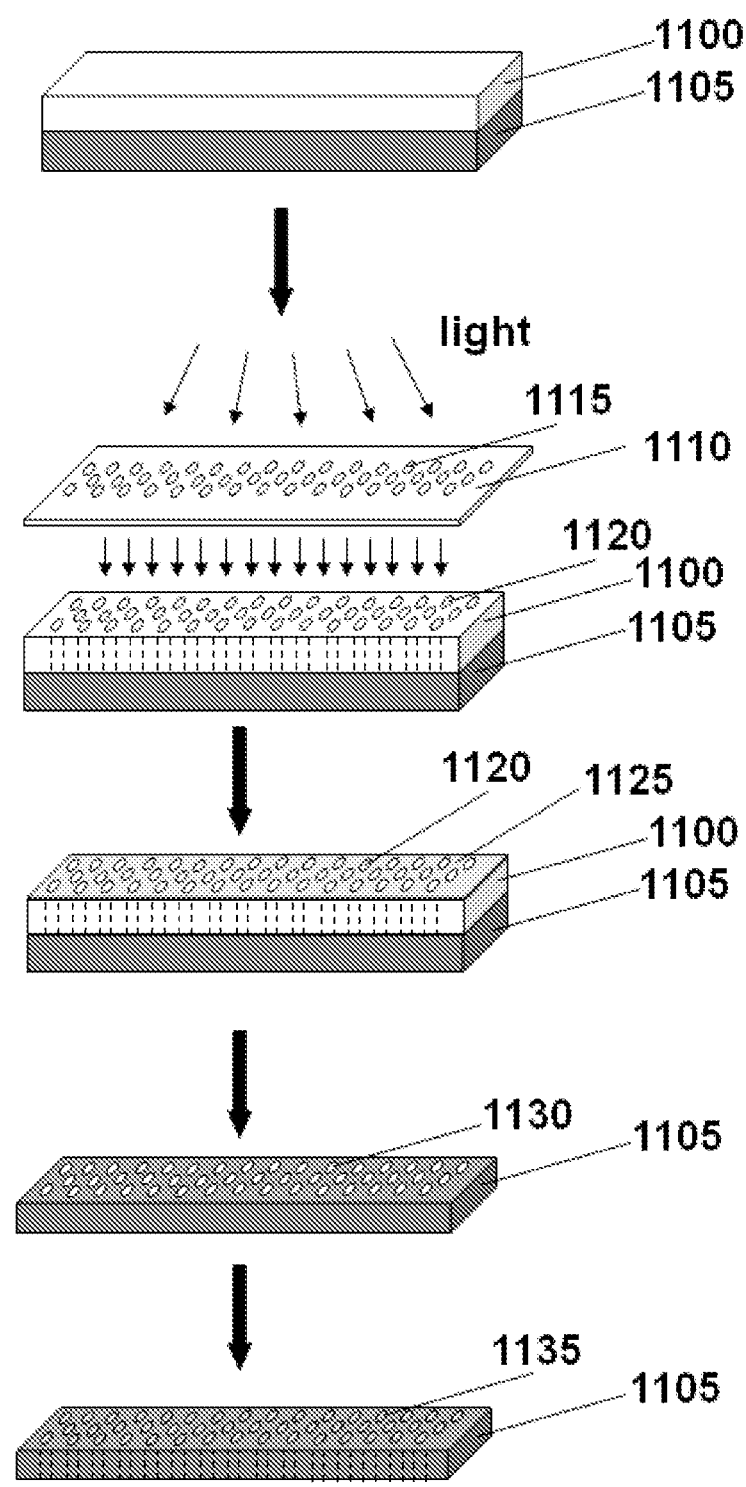
FIG. 11 schematically illustrates a photolithographic method for forming a thermoelectric element for a thermoelectric device.

With reference to FIG. 11, in a first step, a photoresist 1100 is provided adjacent to a substrate 1105. The substrate 1105 can be a semiconductor substrate, such as silicon. The substrate 1105 can be doped n-type or p-type, or in some cases intrinsic. The photoresist 1100 can be formed of a polymeric material, such as a curable polymeric material. The mask 1100 in some cases is a photoresist that is spin-coated onto the substrate 1105.

Next, a mask 1110 is brought in view of the photoresist 1100. The mask 1110 can include features 1115 that correspond to inclusions to be formed in the substrate 1105. The mask 1110 is then exposed to electromagnetic radiation to expose portions of the photoresist 1100 to light. In some cases, the electromagnetic radiation can include photons with energies in the x-ray or ultraviolet portion of the electromagnetic spectrum. Alternatively, the photoresist 1100, through the mask 1110, can be exposed to an electron beam. In some embodiments, exposing portions of the photoresist 1100 to light cures the exposed portions of the photoresist 1100, but not the unexposed portions.

In some cases, the features 1115 are sized and shaped to provide holes of desired shapes and sizes in the photoresist 1100. Such sizes and shapes can be selected to take into account the interference of light.

Following exposure of portions of the photoresist 1100 to light, the template 1110 can be removed and the exposed portions of the photoresist 1100 can be removed to provide features 1120 (e.g., holes) in the photoresist 1100. The exposed portions of the photoresist 1100 can be removed by contacting the photoresist 1100 with a washing solution, such as water, or in some cases selectively dissolving (e.g., with the aid of a resist developer) the exposed portions in relation to the unexposed portions of the photoresist 1100. Selective dissolution can be performed with the aid of a resist developer, such as, for example, conventional developers based upon tetramethylammonium hydroxide. The photoresist 1100 with the features 1120 can then serve as a mask having a pattern of the features 1120 that can be transferred to the substrate 1105. In some cases, the features 1120 are holes that extend to the substrate 1105.

Next, a layer 1125 of metallic material is deposited on the photoresist 1100 and on portions of the substrate 1105 that are exposed through the features 1120. The photoresist 1100 is then removed, such as with the aid of an etching chemistry, to provide metallic particles 1130 adjacent to the substrate 1105. The metallic particles 1130 can have a square or hexagonal packing arrangement, for example.

Next, the metallic particles 1130 and the substrate 1105 are exposed to an oxidizing agent (e.g., $O_3$, $NO_2$, $H_2O_2$) and an etchant (e.g., HF). In some embodiments, the metallic particles 1130 facilitate a catalytic oxidation of the substrate 1105 at the metal-substrate interface, thereby forming an oxide between the metallic material and the substrate. An etchant then removes the oxide. Subsequent oxidation of the substrate 1105 and removal of an oxide formed between the metallic particles 1130 and the substrate 1105 can generate holes 1135 in the substrate 1105. The holes 1135 can have distributions and dimensions described elsewhere herein. In some embodiments, the holes 1135 have lengths that are longer than the widths (or diameters) of the holes (i.e., the holes are anisotropic). The metallic particles 1130 can then be removed with the aid of an etchant to leave holes 1135 in the substrate 1105.

Alternatively, an etch block layer comprising a first metallic material can be deposited on the photoresist 1100 and portions of the substrate 1105 that are exposed through the features 1120. In some cases, the first metallic material can include one or more metals selected from chromium, molybdenum, tungsten, titanium and niobium. The photoresist 1100 can be removed to expose the substrate 1105. Next, an etching layer comprising a second metallic material can be deposited on the etch block layer and exposed portions of the substrate 1105. The second metallic material can be selected from gold, silver, platinum, chromium, molybdenum, tungsten, palladium, other metals (e.g., noble metals), or combinations thereof. The second metallic material can then be exposed to an oxidizing agent (e.g., $O_3$, $NO_2$, $H_2O_2$) and an etchant (e.g., HF), which catalyzes the formation of cylinders (or rods) in the substrate 1105. Any first and second metallic material on the cylinders can then be removed, such as with the aid of a mechanical etching process (e.g., CMP), to leave cylinders (e.g., free-standing cylinders) formed from the substrate 1105. In some situations, the bases of the cylinders are attached to the substrate 1105.

In some embodiments, inclusions, such as holes, are formed substantially through a substrate. That is, a substantial portion of a substrate is used to form inclusions. In other situations, inclusions are formed through a portion of a substrate, and the remainder of the substrate is removed. For example, inclusions can be formed through at most 1%, 2%, 3%, 4%, 5%, 6%, 7%, 8%, 9%, 10%, 20%, 30%, 40%, 50%, 60%, 70%, 80%, 90%, or 99% of the width (i.e., direction from one surface of the substrate to another, parallel surface). This can permit inclusions to be formed in substrates of various widths without the need to set processing parameters to form the inclusions through the entirety of the substrate.

Figure 12:
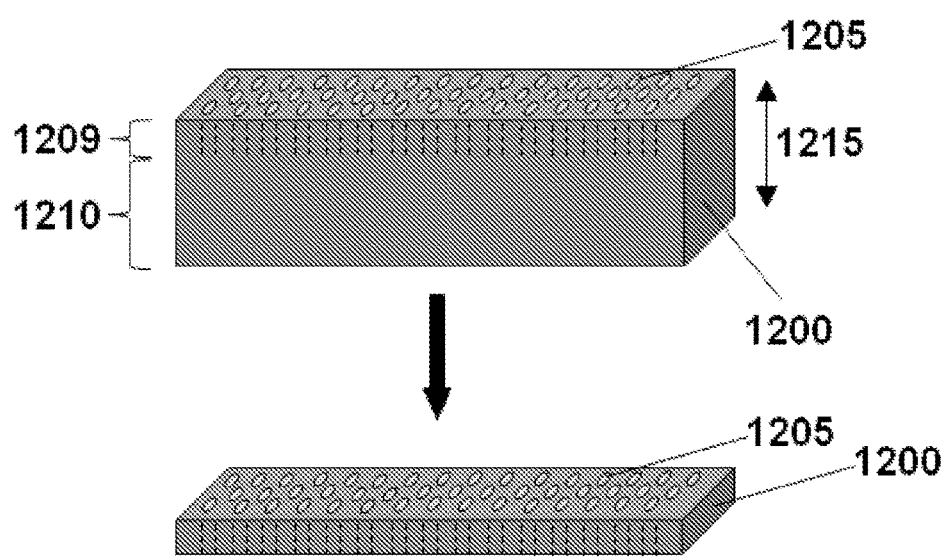
FIG. 12 schematically illustrates a method for forming inclusions in a portion of a substrate, and removing a reminder of the substrate.

FIG. 12 shows a substrate 1200 having holes 1205 formed in a portion of the substrate 1200. The holes 1205 extend through a portion 1209 of the substrate 1200, as indicated by the dashed lines. The holes 1205 extend along a direction that is parallel to a width 1215 of the substrate 1200. The holes in the illustrated example extend through less than 50% of the substrate 1200. The holes can be formed with the aid of any of the methods described above or elsewhere herein. For example, the holes 1205 can be formed by depositing metallic particles on the substrate 1200, and exposing the metallic particles and the substrate 1200 to an oxidizing agent and an etchant to catalytically etch the substrate 1200. Exposure of the substrate 1200 and the metallic particles to the oxidizing agent and the chemical etchant can be timed such that etching is not through substantially all of the substrate 1200.

Once the holes 1205 are formed, a portion 1210 of the substrate 1205 that does not have the holes 1205 can be removed. The portion 1210 in some cases can be removed with the aid of a chemical etching chemistry or a mechanical etching process, such as chemical mechanical polishing (CMP). In an example, CMP is used to remove the portion 1210 by incrementally removing one or more layers of the portion 1210.

In the illustrated example of FIG. 12, inclusions are holes 1205, but wires may be formed from the substrate 1200, such as by initially etching the substrate 1200 to form wires along the width 1215 of the substrate 1200 that is less than 50% of the width.

Metal Particle Deposition Methods

Another aspect provides methods for forming inclusions by catalytically etching a substrate, such as silicon. The catalyst for facilitating the etching is provided by providing an etching layer adjacent to a substrate. The etching layer can be deposited on or adjacent to the substrate. In some cases, the metal particles can be deposited by a galvanic process that involves the reduction of metal ions in solution coupled with the oxidation of the substrate. Such an approach can be used with various methods and processes described herein, such as the method described in the context of FIGS. 9, 11 and 12.

In some embodiments, metal ions in a solution of water and an acid (e.g., hydrofluoric acid) can be reduced on a surface of a semiconductor (e.g., silicon surface), and the semiconductor is concurrently oxidized. This leads to metal deposition adjacent to the semiconductor. Metal atoms deposit at locations at which the semiconductor is exposed to the solution having the metal ions.

In an example, a mask is provided adjacent to a silicon substrate using a block copolymer pattern in a polystyrene matrix. A pattern of holes is then defined in the mask by removing PMMA that has phase separated from polystyrene (see above). Each hole of the pattern of holes exposes a portion of a surface of the silicon substrate. The exposed portions of the silicon substrate and the mask are then exposed to a solution having metal ions (e.g., Au ions), which can result in metal atoms depositing on exposed portions of the silicon substrate from solution. The mask can then be removed to provide a pattern of metal particles on the silicon substrate, which metal particles can be used to catalyze the etching of the silicon substrate to form inclusions (e.g., rods or holes).

As an alternative approach for forming a pattern of metallic particles on a semiconductor substrate, a layer of metallic particles is deposited on the semiconductor substrate by a deposition technique (e.g., physical vapor deposition, chemical vapor deposition). The layer of metallic particles can then be de-wetted upon exposure to a heat source (e.g., hot plate), which raises the temperature of the layer of metallic particles to an elevated temperature, such as a temperature above 500° C., 600° C., 700° C., 800° C., 900° C., 1000° C., 1500° C., or higher. De-wetting the layer of metallic particles produces a random array of metallic particles, such as nanoparticles, which can be subsequently used to catalytically etch the semiconductor substrate to form inclusions.

Figure 13:
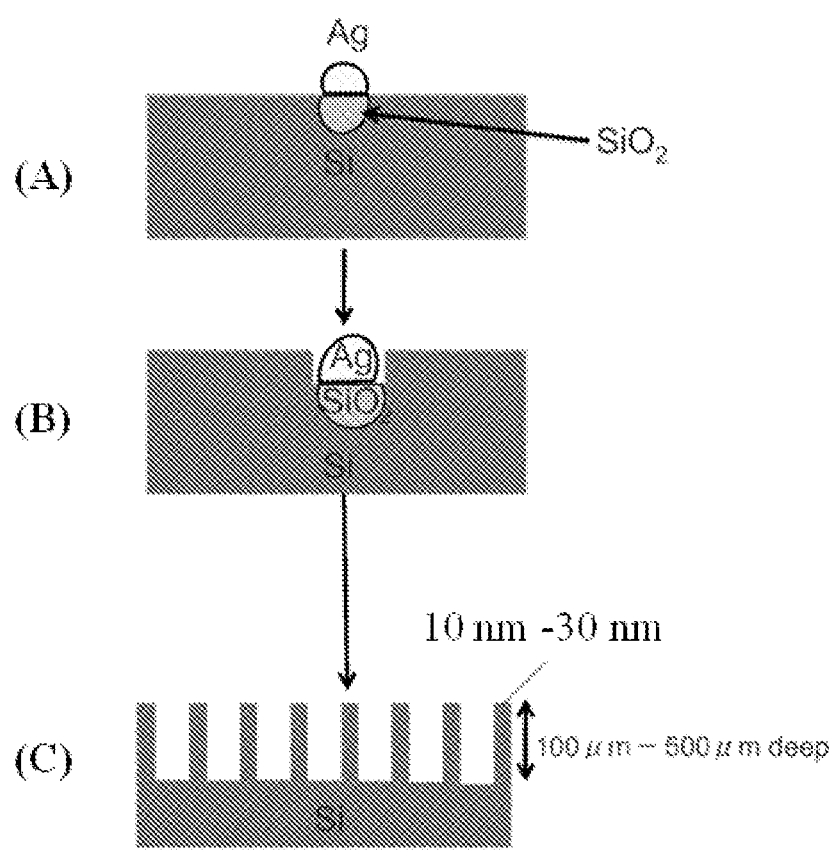
FIGS. 13A-13C schematically illustrates a process for catalytically forming an array of holes, in accordance with an embodiment of the present disclosure.

FIGS. 13A-13C schematically illustrate a process for catalytically etching a silicon substrate, in accordance with an embodiment of the present disclosure. The illustrated process can be applied to various semiconductor materials. In FIG. 13A, an etching layer comprising silver as an etching catalyst is deposited on a silicon substrate. The silicon substrate and the catalyst are exposed to an oxidizing agent, such as hydrogen peroxide ($H_2O_2$), to form silicon dioxide, which is then contact with a chemical etchant, such as hydrofluoric acid (HF), to remove the silicon dioxide (FIG.

13B). Further exposure of the silicon substrate and the catalyst to the oxidizing agent and the chemical etchant forms an array of holes in the silicon substrate, as shown in FIG. 13C. In some situations, the silicon substrate and the catalyst are simultaneously contacted with the oxidizing agent and the chemical etchant, while in other situations the silicon substrate and the catalyst are alternately and sequentially contacted with the oxidizing agent and the chemical etchant.

The process of FIGS. 13A-13C can be used to form a pattern of holes or rods (e.g., wires) in a substrate, such as a semiconductor, insulating or metallic substrate. The pattern can include domains that are substantially periodic. In some cases, the pattern includes domains that are substantially non-periodic.

Figure 14:
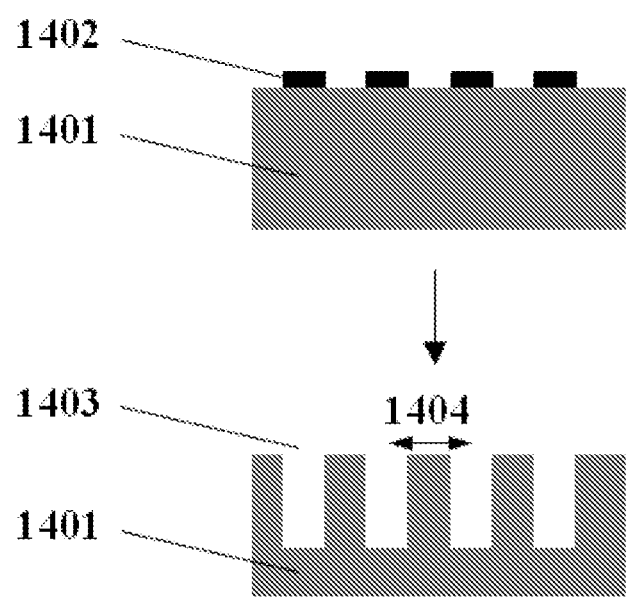
FIG. 14 schematically illustrates a process for forming a pattern of holes, in accordance with an embodiment of the present disclosure.

FIG. 14 schematically illustrates a process for catalytically transferring a pattern to a substrate 1401, in accordance with an embodiment of the present disclosure. The substrate 1401 can be formed of one or more semiconductor materials. The pattern is characterized by the distribution of particles 1402 of a metallic material on the substrate 1401. The metallic material can include one or more of gold, silver, platinum, chromium, molybdenum, tungsten, palladium and other noble metals, and any combinations or alloys thereof. The particles 1402 can be formed as described elsewhere herein, such as, e.g., by forming a mask with a pattern of holes (e.g., nanoholes), depositing the metallic and removing the mask. The particles 1402 can be disposed directly on the substrate 1401, or, alternatively, on one or more intervening layers on the substrate 1401, such as an oxide layer. The metallic particles 1402 and the substrate 1401 are then exposed to a chemical etchant and an oxidizing agent to anisotropically etch the substrate 1401 to provide a pattern of holes 1403 in the substrate 1401. The particles 1402 can then be removed, such as with the aid of an etching chemistry that is selective to the metallic material. The holes 1403 can then be formed with a secondary material, such as a semiconductor or dielectric material, to form inclusions.

The pattern of holes 1403 can have a pitch (e.g., center-to-center spacing between adjacent holes) 1404 that is less than or equal to about 5000 nanometers (nm), or 1000 nm, or 500 nm, or 400 nm, or 300 nm, or 200 nm, or 100 nm, or 50 nm, or 40 nm, or 30 nm, or 20 nm, or 15 nm, or 10 nm, or 5 nm, or less. Exposed surfaces of each of the holes 1403 can have a roughness, as measured by transmission electron microscopy (TEM), between about 0.5 nm and 50 nm, or 1 nm and 20 nm, or 1 nm and 10 nm.

At least a fraction of the metallic material from the particles 1402 can be deposited on the exposed surfaces of the holes 1403. This may be the case if, for example, a residual amount of the metallic materials remain after removal of the particles 1402. In some cases, the fraction of metallic material adsorbed on the exposed surfaces of the holes 1403, taken against the number of surface atoms on the exposed surfaces, is at least about 0.000001%, 0.00001%, 0.0001%, 0.001%, 0.01%, 0.1%, 1%, 5%, 10%, 15%, or 20%, as measured by x-ray photoelectron spectroscopy (XPS). In other cases, however, the fraction of metallic material adsorbed on the exposed surfaces of the holes 1403, taken against the number of surface atoms on the exposed surfaces, is at most about 0.000001%, 0.00001%, 0.0001%, 0.001%, 0.01%, 0.1%, 1%, 5%, 10%, 15%, 20%, or 25%, as measured by XPS. In some situations, the fraction of metallic material adsorbed on exposed surfaces of the holes 1403, taken against the number of surface atoms on the exposed surfaces, is between about 0.000001% and 25%, as measured by XPS.

Figure 15:
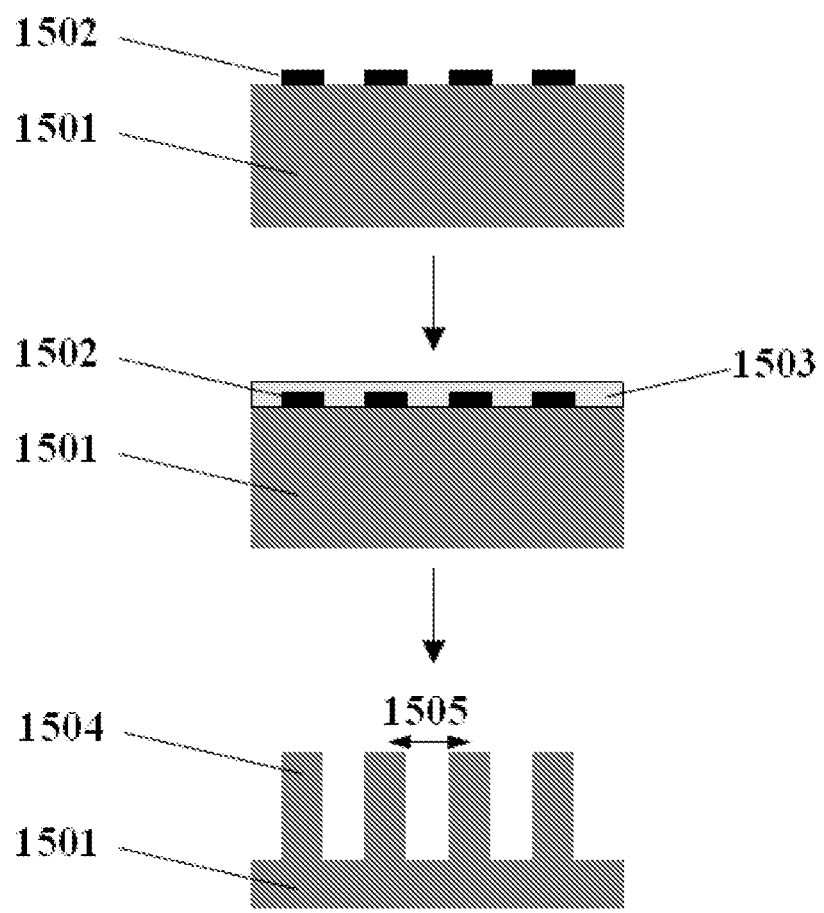
FIG. 15 schematically illustrates a process for forming a pattern of wires, in accordance with an embodiment of the present disclosure.

FIG. 15 schematically illustrates a process for catalytically transferring a pattern to a substrate 1501, in accordance with an embodiment of the present disclosure. In a first step, a first layer 1502 of particles having an etch block material is formed on the substrate 1501, as described elsewhere herein, such as, e.g., by forming a mask with a pattern of holes, depositing the first layer 1502 and removing the mask. The first layer 1502 can include a plurality of particles. The material of the first layer 1502 can include one or more of chromium, molybdenum and tungsten. The particles of the first layer 1502 may be disposed directly on the substrate 1501, or, alternatively, on one or more intervening layers on the substrate 1501, such as an oxide layer (e.g., a native oxide layer). A second layer 1503 having a metallic material is then deposited on the first layer 1502, as described elsewhere herein. The material of the second layer 1503 may be different from the material of the first layer 1502. The metallic material of the second layer 1503 can include one or more of gold, silver, platinum, palladium and other noble metals. Next, the first layer 1502 and second layer 1503 are exposed to a chemical etchant and an oxidizing agent. With the first layer serving as a mask (or etch block layer), the metallic material of the second layer 1503 etches portions of the substrate 1501 that are in contact with the second layer 1503. Portions of the substrate 1501 that are in contact with the first layer 1502 may not be etched. This provides a pattern of wires (e.g., nanowires) 1504 in the substrate 1501. The material comprising the first layer 1502 and second layer 1503 may then be removed, such as with the aid of an etching chemistry that is selective to the metallic materials and not the material comprising the substrate 1501.

The pattern of wires 1504 may have a pitch 1505 that is less than or equal to about 5000 nanometers (nm), or 1000 nm, or 500 nm, or 400 nm, or 300 nm, or 200 nm, or 100 nm, or 50 nm, or 40 nm, or 30 nm, or 20 nm, or 15 nm, or 10 nm, or 5 nm, or less. Exposed surfaces of each of the wires 1504 may have a roughness, as measured by transmission electron microscopy (TEM), between about 0.5 nm and 50 nm, or 1 nm and 20 nm, or 1 nm and 10 nm.

At least a fraction of the metallic material from the first layer 1502 and/or the second layer 1503 may be deposited on the exposed surfaces of the wires 1504. This may be the case if, for example, a residual amount of one or both of the metallic materials remains on the exposed surfaces of the wires 1504 after removal of the first layer 1502 and the second layer 1503. In some cases, the fraction of metallic material adsorbed on the exposed surfaces of the wires 1504, taken against the number of surface atoms on the exposed surfaces, is at least about 0.000001%, 0.00001%, 0.0001%, 0.001%, 0.01%, 0.1%, 1%, 5%, 10%, 15%, or 20%, as measured by XPS. In other cases, however, the fraction of metallic material adsorbed on the exposed surfaces of the wires 1504, taken against the number of surface atoms on the exposed surfaces, is at most about 0.000001%, 0.00001%, 0.0001%, 0.001%, 0.01%, 0.1%, 1%, 5%, 10%, 15%, 20%, or 25%, as measured by XPS. In some situations, the fraction of metallic material adsorbed on exposed surfaces of the wires 1504, taken against the number of surface atoms on the exposed surfaces, is between about 0.000001% and 25%, as measured by XPS.

A hole or wire of the disclosure may have a surface roughness that is suitable for optimized thermoelectric device performance. In some cases, the root mean square roughness of a hole or wire is between about 0.1 nm and 50 nm, or 1 nm and 20 nm, or 1 nm and 10 nm. The roughness can be determined by transmission electron microscopy (TEM) or other surface analytical technique, such as atomic force microscopy (AFM) or scanning tunneling microscopy (STM). The surface roughness may be characterized by a surface corrugation.

Exposed surfaces of holes or wires may be covered with a layer of an oxide, such as a semiconductor oxide, metal oxide, or a semiconductor and metal oxide. In some cases, the oxide is a native oxide, such as a native oxide or silicon (e.g., $SiO_2$).

The doping configuration of thermoelectric elements of the disclosure may be selected to control the thermal conductivity and thermoelectric power of a thermoelectric device having the thermoelectric elements. The thermal conductivity and the thermoelectric power may be controlled substantially independently of the electrical conductivity of the thermoelectric elements by controlling dimensions and doping, respectively, of the thermoelectric elements. As an example, the doping p-type or n-type doping concentration of thermoelectric elements comprising holes or wires may be controlled independently of the dimensions (e.g., length, hole or wire diameters) of the thermoelectric elements. Various approaches for controlling thermal conductivity and thermoelectric power of semiconductor nanowires are described in U.S. Patent Publication No. 2009/0020148 ("METHODS AND DEVICES FOR CONTROLLING THERMAL CONDUCTIVITY AND THERMOELECTRIC POWER OF SEMICONDUCTOR NANOWIRES"), which is entirely incorporated herein by reference.

Methods described herein can be implemented using systems at ultrahigh vacuum, high vacuum, vacuum, low pressure, ambient pressure or high pressure. In some cases, thermoelectric elements are formed at low pressure, such as using a vacuum chamber. In other cases, thermoelectric elements are formed in air. Alternatively, thermoelectric elements can be formed in an inert gas (e.g., $N_2$, Ar, He) atmosphere.

Computer Systems

Methods described herein can be automated with the aid of computer systems having storage locations with machine-executable code implementing the methods provided herein, and one or more processors for executing the machine-executable code.

Figure 16:
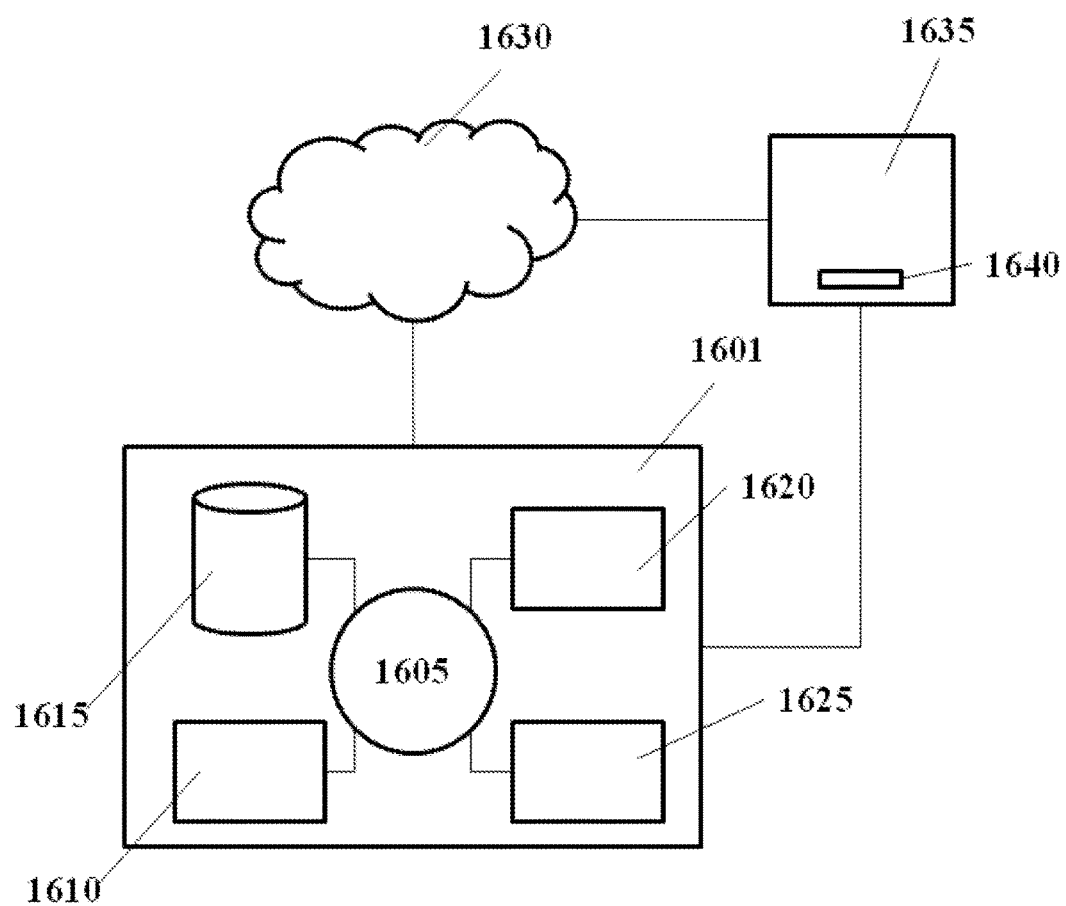
FIG. 16 schematically illustrates a computer system that is programmed or otherwise configured to implement the methods of the disclosure.

FIG. 16 shows a computer system (also "system" herein) 1601 programmed or otherwise configured to facilitate the formation of thermoelectric devices of the disclosure. The system 1601 can be programmed or otherwise configured to implement methods described herein. The system 1601 includes a central processing unit (CPU, also "processor" and "computer processor" herein) 1605, which can be a single core or multi core processor, or a plurality of processors for parallel processing. The system 1601 also includes memory 1610 (e.g., random-access memory, read-only memory, flash memory), electronic storage unit 1615 (e.g., hard disk), communications interface 1620 (e.g., network adapter) for communicating with one or more other systems, and peripheral devices 1625, such as cache, other memory, data storage and/or electronic display adapters. The memory 1610, storage unit 1615, interface 1620 and peripheral devices 1625 are in communication with the CPU 1605 through a communications bus (solid lines), such as a motherboard. The storage unit 1615 can be a data storage unit (or data repository) for storing data. The system 1601 is operatively coupled to a computer network ("network") 1630 with the aid of the communications interface 1620. The network 1630 can be the Internet, an internet and/or extranet, or an intranet and/or extranet that is in communication with the Internet. The network 1630 in some cases is a telecommunication and/or data network. The network 1630 can include one or more computer servers, which can enable distributed computing, such as cloud computing. The network 1630 in some cases, with the aid of the system 1601, can implement a peer-to-peer network, which may enable devices coupled to the system 1601 to behave as a client or a server.

The system 1601 is in communication with a processing system 1635 for forming thermoelectric devices of the disclosure. The processing system 1635 can be configured to implement various operations to form holes or wires in a substrate 1640 in the processing system 1635, such directing an oxidizing agent and a chemical etchant to the substrate, when appropriate, to form holes in, or wires from, the substrate. The processing system 1635 can be in communication with the system 1601 through the network 1630, or by direct (e.g., wired, wireless) connection. In an example, the processing system 1635 is a vacuum chamber. In another example, the processing system 1635 is a dry box.

Methods as described herein can be implemented by way of machine (or computer processor) executable code (or software) stored on an electronic storage location of the system 1601, such as, for example, on the memory 1610 or electronic storage unit 1615. During use, the code can be executed by the processor 1605. In some examples, the code can be retrieved from the storage unit 1615 and stored on the memory 1610 for ready access by the processor 1605. In some situations, the electronic storage unit 1615 can be precluded, and machine-executable instructions are stored on memory 1610.

The code can be pre-compiled and configured for use with a machine have a processer adapted to execute the code, or can be compiled during runtime. The code can be supplied in a programming language that can be selected to enable the code to execute in a pre-compiled or as-compiled fashion.

Aspects of the systems and methods provided herein, such as the system 1601, can be embodied in programming. Various aspects of the technology may be thought of as "products" or "articles of manufacture" typically in the form of machine (or processor) executable code and/or associated data that is carried on or embodied in a type of machine readable medium. Machine-executable code can be stored on an electronic storage unit, such memory (e.g., read-only memory, random-access memory, flash memory) or a hard disk. "Storage" type media can include any or all of the tangible memory of the computers, processors or the like, or associated modules thereof, such as various semiconductor memories, tape drives, disk drives and the like, which may provide non-transitory storage at any time for the software programming. All or portions of the software may at times be communicated through the Internet or various other telecommunication networks. Such communications, for example, may enable loading of the software from one computer or processor into another, for example, from a management server or host computer into the computer platform of an application server. Thus, another type of media that may bear the software elements includes optical, electrical and electromagnetic waves, such as used across physical interfaces between local devices, through wired and optical landline networks and over various air-links. The physical elements that carry such waves, such as wired or wireless links, optical links or the like, also may be considered as media bearing the software. As used herein, unless restricted to non-transitory, tangible "storage" media, terms such as computer or machine "readable medium" refer to any medium that participates in providing instructions to a processor for execution.

Hence, a machine readable medium, such as computer-executable code, may take many forms, including but not limited to, a tangible storage medium, a carrier wave medium or physical transmission medium. Non-volatile storage media include, for example, optical or magnetic disks, such as any of the storage devices in any computer(s) or the like, such as may be used to implement the databases, etc. shown in the drawings. Volatile storage media include dynamic memory, such as main memory of such a computer platform. Tangible transmission media include coaxial cables; copper wire and fiber optics, including the wires that comprise a bus within a computer system. Carrier-wave transmission media may take the form of electric or electromagnetic signals, or acoustic or light waves such as those generated during radio frequency (RF) and infrared (IR) data communications. Common forms of computer-readable media therefore include for example: a floppy disk, a flexible disk, hard disk, magnetic tape, any other magnetic medium, a CD-ROM, DVD or DVD-ROM, any other optical medium, punch cards paper tape, any other physical storage medium with patterns of holes, a RAM, a ROM, a PROM and EPROM, a FLASH-EPROM, any other memory chip or cartridge, a carrier wave transporting data or instructions, cables or links transporting such a carrier wave, or any other medium from which a computer may read programming code and/or data. Many of these forms of computer readable media may be involved in carrying one or more sequences of one or more instructions to a processor for execution.

While various embodiments described herein have made reference to semiconductor substrates, methods described above may be employed for use with other types of substrates, such as substrates formed of metallic or insulating (dielectric) materials.

Unless the context clearly requires otherwise, throughout the description and the claims, the words 'comprise,' 'comprising,' and the like are to be construed in an inclusive sense as opposed to an exclusive or exhaustive sense; that is to say, in a sense of 'including, but not limited to.' Words using the singular or plural number also include the plural or singular number respectively. Additionally, the words 'herein,' 'hereunder,' 'above,' 'below,' and words of similar import refer to this application as a whole and not to any particular portions of this application. When the word 'or' is used in reference to a list of two or more items, that word covers all of the following interpretations of the word: any of the items in the list, all of the items in the list and any combination of the items in the list.

Devices, systems and methods provided herein may be combined with or modified by other devices, systems and methods, such as devices, systems and/or methods described in U.S. Pat. No. 7,309,830 to Zhang et al., U.S. Patent Publication No. 2006/0032526 to Fukutani et al. U.S. Patent Publication No. 2009/0020148 to Boukai et al., and U.S. patent application Ser. No. 13/550,424 to Boukai et al. ("THERMOELECTRIC DEVICES, SYSTEMS AND METHODS"), each of which is entirely incorporated herein by reference.

It should be understood from the foregoing that, while particular implementations have been illustrated and described, various modifications may be made thereto and are contemplated herein. An embodiment of one aspect of the disclosure may be combined with or modified by an embodiment of another aspect of the disclosure. It is not intended that the invention(s) be limited by the specific examples provided within the specification. While the invention(s) has (or have) been described with reference to the aforementioned specification, the descriptions and illustrations of embodiments of the invention(s) herein are not meant to be construed in a limiting sense. Furthermore, it shall be understood that all aspects of the invention(s) are not limited to the specific depictions, configurations or relative proportions set forth herein which depend upon a variety of conditions and variables. Various modifications in form and detail of the embodiments of the invention(s) will be apparent to a person skilled in the art. It is therefore contemplated that the invention(s) shall also cover any such modifications, variations and equivalents.

What is claimed is:

1. A method for forming a thermoelectric element, comprising:
    (a) providing a mask adjacent to a substrate, said mask comprising a polymeric mixture;
    (b) bringing a template having a first pattern comprising rods in contact with said mask to define a second pattern in said mask, wherein said second pattern exposes portions of said substrate through said mask;
    (c) depositing an etch block layer on said portions of said substrate exposed through said mask, wherein said etch block layer comprises a first metallic material, and removing said mask;
    (d) subsequent to removing said mask, depositing an etching layer adjacent to said substrate, wherein said etching layer comprises metallic particles comprising a second metallic material configured to catalytically etch said substrate, wherein said first metallic material is configured to limit or prevent etching of said substrate that is facilitated by said second metallic material; and
    (e) using said metallic particles to catalytically etch said substrate to form holes in said substrate, thereby forming said thermoelectric element.

2. The method of claim 1, wherein, in (d), said etching layer is deposited on said etch block layer and adjacent to said substrate, wherein said etch block layer comprises a material that reduces an etch rate of portions of said substrate that are adjacent to said etch block layer.

3. The method of claim 1, wherein, subsequent to (c), said mask is removed, and wherein removal of said mask exposes portions of said substrate.

4. The method of claim 1, wherein an individual hole has a surface with a metal content of at least about 0.000001%.

5. The method of claim 1, wherein said holes have an aspect ratio of at least about 100:1.

6. The method of claim 1, wherein said holes have an aspect ratio of at least about 1000:1.

7. The method of claim 1, wherein in (e) said metallic particles are exposed to an oxidizing agent and a chemical etchant.

8. The method of claim 7, wherein said metallic particles are exposed to said oxidizing agent and said chemical etchant simultaneously.

9. The method of claim 7, wherein said metallic particles are exposed to said oxidizing agent and said chemical etchant sequentially.

10. The method of claim 7, wherein exposure of said metallic particles to said oxidizing agent and said chemical etchant is timed such that said etching is not through substantially all of said substrate.

11. The method of claim 1, wherein in (e) said substrate is exposed to an oxidizing agent and a chemical etchant.

12. The method of claim 11, wherein said substrate is exposed to said oxidizing agent and said chemical etchant simultaneously.

13. The method of claim 1, wherein said first metallic material comprises one or more metals selected from the group consisting of chromium, molybdenum, tungsten, titanium and niobium.

14. The method of claim 1, wherein said substrate is a semiconductor substrate.

15. The method of claim 1, wherein said holes have an aspect ratio of at least about 5000:1.

16. The method of claim 1, wherein said holes have an aspect ratio of at least about 10,000:1.

17. The method of claim 1, wherein said metallic particles are deposited on said substrate by physical vapor deposition.

18. The method of claim 1, wherein said metallic particles are nanoparticles.

19. The method of claim 1, wherein a root mean square roughness of a given one of said holes is between about 0.1 nm and 50 nm determined by transmission electron microscopy (TEM).

20. The method of claim 19, wherein said root mean square roughness of one of said holes is between about 1 nm and 20 nm determined by TEM.

* * * * *